US009716582B2

(12) United States Patent
Ramezani et al.

(10) Patent No.: US 9,716,582 B2
(45) Date of Patent: Jul. 25, 2017

(54) DESERIALIZED DUAL-LOOP CLOCK RADIO AND DATA RECOVERY CIRCUIT

(71) Applicant: Rambus Inc., Sunnyvale, CA (US)

(72) Inventors: Mehrdad Ramezani, Toronto (CA); David J. Cassan, Toronto (CA); Christopher D. Holdenried, Toronto (CA); Sang-Wook Paul Park, Toronto (CA); Marcus van Ierssel, Ontario (CA)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/871,719

(22) Filed: Sep. 30, 2015

(65) Prior Publication Data

US 2017/0093558 A1    Mar. 30, 2017

(51) Int. Cl.
*H04L 7/00* (2006.01)
*H04L 25/03* (2006.01)
*H04L 7/033* (2006.01)

(52) U.S. Cl.
CPC .......... *H04L 7/0087* (2013.01); *H04L 7/0029* (2013.01); *H04L 7/0331* (2013.01); *H04L 25/03057* (2013.01)

(58) Field of Classification Search
CPC ... H04L 7/0337; H04L 7/0334; H04L 7/0008; H04L 7/02
USPC .................................................. 375/355, 354
See application file for complete search history.

(56) References Cited

U.S. PATENT DOCUMENTS

| 5,953,386 A * | 9/1999 | Anderson ............... H03L 7/087 327/156 |
| 6,683,930 B1 * | 1/2004 | Dalmia ................ H03D 13/004 375/373 |
| 7,366,267 B1 * | 4/2008 | Lee ........................ H03K 5/135 341/100 |
| 7,577,225 B2 * | 8/2009 | Azadet .................... H03L 7/087 327/147 |
| 8,170,169 B2 | 5/2012 | Martin et al. |
| 8,532,240 B2 * | 9/2013 | Tracy ................ H04L 25/03038 375/233 |

(Continued)

OTHER PUBLICATIONS

N. Dodel et al., "10 Gb/s Bang-Bang Clock and Data Recovery (CDR) for Optical Transmission Systems", Advances in Radio Science, 3, pp. 293-297, 2005.

(Continued)

*Primary Examiner* — Helene Tayong
(74) *Attorney, Agent, or Firm* — The Neudeck Law Firm, LLC

(57) ABSTRACT

A clock and data recovery circuit (CDR) includes a digitally controlled oscillator (DCO). A data sampler is coupled to receive a clock signal from the DCO. A deserializer includes an input coupled to an output of the data sampler. A first phase detector is coupled between a first output of the deserializer and a first input of the DCO. A second phase detector is coupled to a second output of the deserializer. An accumulator is coupled between an output of the second phase detector and a second input of the DCO. A frequency lock detection block is coupled to an output of the accumulator. An eye monitor is coupled to an input of the data sampler. The first phase detector controls a delay of the DCO and the accumulator controls a frequency of the DCO. An edge mute signal is coupled to the deserializer.

21 Claims, 11 Drawing Sheets

(56) References Cited

U.S. PATENT DOCUMENTS

| | | | |
|---|---|---|---|
| 8,687,739 B1 | 4/2014 | Huynh | |
| 2005/0147194 A1* | 7/2005 | Koenenkamp | H03L 7/0814 375/348 |
| 2005/0238093 A1* | 10/2005 | Payne | G01R 31/31715 375/224 |
| 2007/0043991 A1* | 2/2007 | Nguyen | H03M 9/00 714/731 |
| 2011/0075781 A1* | 3/2011 | Kenney | H03L 7/235 375/376 |
| 2012/0177159 A1* | 7/2012 | Kong | H03L 7/07 375/359 |
| 2013/0222026 A1* | 8/2013 | Havens | H03L 7/0995 327/158 |

OTHER PUBLICATIONS

J. Sonntag et al., "A Digital Clock and Data Recovery Architechture for Multi-Gigabit/s Binary Links", IEEE Journal of Solid-State Circuits, vol. 41, No. 8, Aug. 2006.

Lecture 200—Clock and Data Recovery Circuits, ECE 6440—Frequency Synthesizers, pp. 1-16, Jun. 2003.

\* cited by examiner

DESERIALIZED DUAL-LOOP CLOCK RADIO AND DATA RECOVERY CIRCUIT

FIELD OF THE INVENTION

The present invention relates in general to semiconductor devices and, more particularly, to a deserialized dual-loop clock and data recovery circuit.

BACKGROUND OF THE INVENTION

Data transmission over cables and wires has enabled much of the economic and technological development over the last few decades. From early electrical telegraph lines by Samuel Morse, to copper cable lines distributing news, entertainment, and high speed internet. Today, the cutting edge of data transmission is in fiber optic communication. Optical fiber is used by many telecommunications companies to transmit telephone, internet, and television signals. Optical communication technology is also commonly used in private and corporate networks, home and commercial theater technology, as well as myriad other sectors.

Due to lower attenuation and interference, optical fiber has large advantages over existing copper wire in long-distance and high-speed applications. However, many challenges still exist in maximizing the data transfer rate over fiber optics. To receive optical data, a clock and data recovery (CDR) circuit is required to reconstruct separate clock and data signals from a single serial data signal.

Many prior art CDR circuits include logic that must run at the same frequency as the received data signal, which makes low-cost and high-speed fiber optic receivers difficult to produce. An incoming optical signal is converted to a corresponding electrical signal using a photodiode. On-off keying (OOK) or amplitude shift keying (ASK) are commonly used to encode data on a carrier wave, but other signal types are used as well.

The electrical signal is converted to binary data by sampling the electrical signal between transitions of the data signal, and the signal is also sampled at the data transitions. The data samples that occur between data transitions are in-phase (I) samples, and the data samples that occur at the transitions are quadrature (Q) samples. In-phase, or data, samples and quadrature, or edge, samples are compared to identify whether a quadrature sample occurred before or after an actual transition of the incoming data signal. The sample clock is adjusted accordingly to stay synchronized with the incoming data signal.

A half-rate phase interpolator (PI) CDR uses multiple samplers and multiple evenly spaced sampling clocks to reduce the clock frequency of CDR logic. However, prior art half-rate CDRs require an external reference clock input which can reduce jitter tolerance when the reference clock input is at an offset frequency compared to the clock signal of the received data signal. The frequency offset can be overcome by adjusting the external reference clock frequency, but then a separate reference clock is required for each CDR receiving data at a different data rate. Even if a group of CDRs is receiving data at the same rate, clock distribution and buffering will use a significant amount of power.

SUMMARY OF THE INVENTION

A need exists for a clock and data recovery (CDR) circuit that operates at a reduced clock frequency, does not require an external reference clock source, and allows for adjustment of the timing of in-phase versus quadrature sampling. Accordingly, in one embodiment, the present invention is a clock and data recovery circuit (CDR) including a digitally controlled oscillator (DCO). A data sampler is coupled to receive a clock signal from the DCO. A deserializer includes an input coupled to an output of the data sampler. A first phase detector is coupled between a first output of the deserializer and a first input of the DCO. A second phase detector is coupled to a second output of the deserializer. An accumulator is coupled between an output of the second phase detector and a second input of the DCO.

In another embodiment, the present invention is a CDR comprising a clock generator. A data sampler is coupled to receive a clock signal from the clock generator. A deserializer is coupled to an output of the data sampler. A first phase detector is coupled between a first output of the deserializer and a first input of the clock generator. A second phase detector is coupled between a second output of the deserializer and a second input of the clock generator.

In another embodiment, the present invention is a CDR comprising a data sampler. A deserializer is coupled to an output of the data sampler. A first phase detector is coupled to receive a first set of data from the deserializer. A second phase detector is coupled to receive a second set of data from the deserializer.

In another embodiment, the present invention is a method of making a CDR comprising the steps of providing a data sampler, coupling a deserializer to an output of the data sampler, coupling a first phase detector to receive a first set of data from the deserializer, and coupling a second phase detector to receive a second set of data from the deserializer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
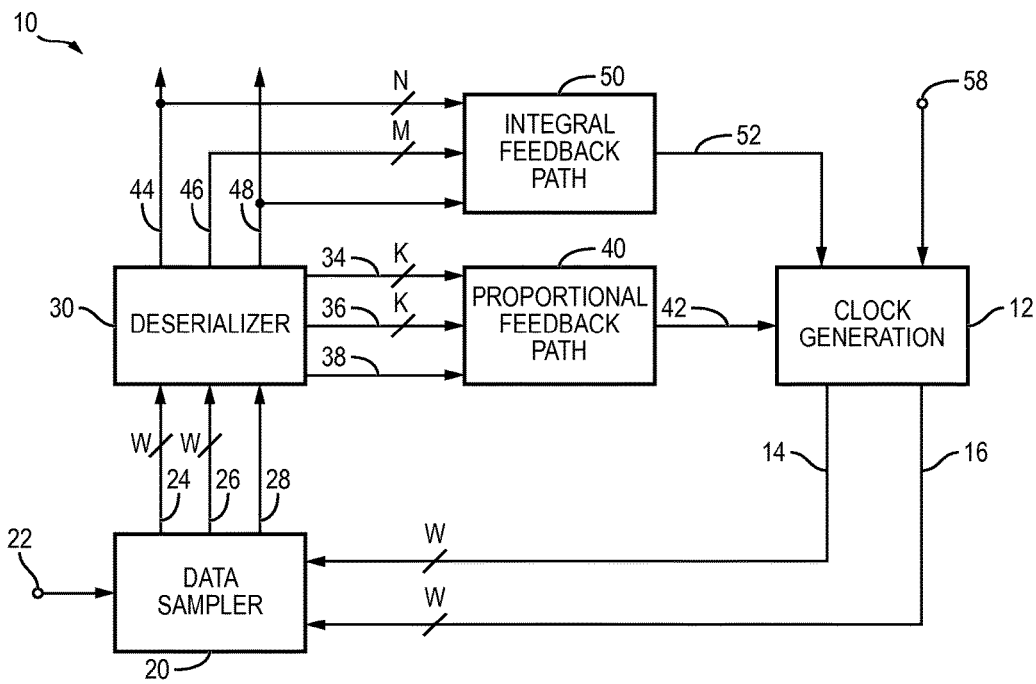
FIG. 1 illustrates a block diagram of a dual-loop clock and data recovery (CDR) circuit.

FIG. 1 illustrates a block diagram of a clock and data recovery (CDR) circuit 10. CDR 10 is used in a semiconductor device to receive a serial data signal via an optical or electrical signal. The semiconductor device is a board including semiconductor packages mounted to the board, an application specific integrated circuit (ASIC), a field-programmable gate array (FPGA), or another type of device in various embodiments. An optical signal is received via a fiber optic cable in one embodiment. An electrical signal is received via a copper coax cable or a twisted pair in another embodiment. CDR 10 includes a clock generation block 12 which outputs one or more in-phase clock signals 14, e.g., W in-phase clock signals, and one or more quadrature clock signals 16, e.g., W quadrature clock signals, to data sampler block 20. Data sampler block 20 samples input serial data 22 using each in-phase clock 14 and each quadrature clock 16. Data sampler block 20 outputs W center data samples 24, W edge samples 26, and clock 28 to deserializer 30. Deserializer 30 outputs K center data samples 34, K edge samples 36, and clock 38 to proportional feedback path 40. Proportional feedback path 40 outputs a phase error signal 42 to clock generation block 12. Deserializer 30 also outputs N center data samples 44, M edge samples 46, and clock 48 to integral feedback path 50. Integral feedback path 50 outputs a frequency error signal 52 to clock generation block 12. Clock generation block 12 also receives a reference clock signal 58 from a source external CDR 10.

Input serial data 22 is a serial data signal with data bits being received at a baud rate. Baud rate is the rate at which information is transferred over a communication channel. For instance, a 9600 baud serial communication link is capable of transmitting 9600 bits of information every second. If input serial data 22 at 9600 baud changed value from a binary one to a binary zero every bit, the signal would look like a clock signal operating at 9600 hertz (Hz). In practice, input serial data 22 received by CDR 10 is generally operating in the gigahertz range or faster.

In one embodiment, CDR 10 is a half-rate CDR. Half-rate means that data sampler block 20 includes two center data samplers and two edge samplers which each operates at half the frequency that a single data sampler in a full-rate CDR would have to run at. A full-rate CDR requires a sampler operating at a frequency equivalent to the baud rate of an incoming serial signal. A half-rate CDR includes duplicate data sampling circuitry, each operating at half the baud rate frequency, which alternate to each sample every other incoming data bit. In some embodiments, CDR 10 is a quarter-rate CDR which uses four data sampling circuits operating in parallel, each operating at one quarter of the input serial data 22 baud rate and each being used to sample one out of every four data bits of input serial data 22. In other embodiments, data sampler block 20 uses any number of data samplers, e.g., W data samplers, operating in parallel to reduce the operating frequency of each data sampler by a factor of W.

The letter W represents the number of data samplers used in parallel by data sampler block 20. For a half-rate CDR 10, W is equal to 2. For a quarter-rate CDR 10, W is equal to 4. For a full-rate CDR 10, W is equal to 1. CDR 10 could be a full-rate CDR, half-rate CDR, quarter-rate CDR, or W could be equal to any other number in other embodiments. For each data sampler of data sampler block 20, clock generation block 12 creates an in-phase clock signal 14 and a quadrature clock signal 16. Therefore, clock generation block 12 generates W in-phase clock signals 14 and W quadrature clock signals 16, and each of the 2W total clock signals 14-16 is routed to data sampler block 20. For a half-rate CDR 10, W is equal to 2. Clock generation block 12 generates two in-phase clock signals 14, referred to hereinafter as clocks 14[0] and 14[1], and two quadrature clock signals 16, referred to hereinafter as clocks 16[0] and 16[1].

A clock signal is a signal that oscillates between two values, referred to as a binary one value and a binary zero value, at a generally static frequency and generally with an approximately fifty percent duty cycle. The binary one is usually manifested as a positive voltage on the clock signal line, and the binary zero is usually a voltage at approximately ground potential. A clock period includes a rising edge or transition, and a falling transition. When the clock signal transitions from a binary zero value to a binary one value, the transition is known as a rising transition. When the clock signal transitions from a binary one value to a binary zero value, the transition is known as a falling transition. Sequential logic circuits, e.g., flip-flops, generally operate on the rising transition of each clock cycle, which is assumed to be the case hereinafter. However, the disclosed circuits operate on the falling edge, or on both the falling and rising edges, in other embodiments.

Each of the W in-phase clocks 14 includes a rising transition of the in-phase clock occurring near a center of a serial data bit of input serial data 22 when CDR 10 is locked onto the data rate of the input serial data. When W is equal to two, each of the two individual in-phase clocks 14 includes a rising edge near the middle of alternating data bits of input serial data 22. A first in-phase clock 14[0] is used by data sampler block 20 to sample a first data bit of input serial data 22, and then a second in-phase clock 14[1] is used to sample a second data bit of the input serial data. Next, clock signal 14[0] is used again to sample a third data bit, clock signal 14[1] is used to sample a fourth data bit, and so on. Each individual in-phase clock 14 operates at half the baud rate of input serial data 22, and each in-phase clock is used to sample every other bit received. The in-phase clocks 14 alternate sampling phases so that each bit of input serial data 22 is sampled using one of the in-phase clocks. With W equal to four, four in-phase clocks 14 are provided, each at one quarter of the baud rate of input serial data 22, and each in-phase clock triggering an individual sampler of data sampler block 20 repeatedly in order, i.e., every fourth bit of input serial data 22.

Each of the quadrature clocks 16 nominally includes a rising transition of the quadrature clock occurring on an edge between two adjacent data bits of input serial data 22 when CDR 10 is locked into the frequency of the input serial data. When W is equal to two, each of the two individual quadrature clocks 16 includes a rising transition near alternating edges of input serial data 22. A first quadrature clock 16[0] is used by data sampler 20 to sample a first edge of input serial data 22 after in-phase clock 14[0] samples the center of the previous data bit. A second quadrature clock 16[1] is used by data sampler 20 to sample a second edge of input serial data 22 after in-phase clock 14[1] samples the center of the previous data bit. Clock signal 16[0] is then used to sample a third edge of input serial data 22, clock signal 16[1] is used to sample a fourth edge of the input serial data, and so on. Quadrature clocks 16 are each used by data sampler block 20 to sample every second data edge, and the quadrature clocks are out of phase such that each quadrature clock 16 triggers a sample on the edges of input serial data 22 that the other quadrature clock misses. With W equal to four, four quadrature clocks 16 are provided, with each quadrature clock running at one quarter of the input serial data 22 baud rate. Each of the quadrature clocks 16 is used to sample one out of every four edges of input serial data 22. Quadrature clocks 16 include phases designed so that each input serial data edge is sampled using one of the four quadrature clocks, which alternate in order.

Together, in-phase clocks 14 include a single rising transition of one of the in-phase clocks occurring approximately at the center of each data bit of input serial data 22, and quadrature clocks 16 include a single rising transition of one of the quadrature clocks occurring approximately at the edge between every two adjacent data bits. Data sampler block 20 samples input serial data 22 using each in-phase clock 14 and each quadrature clock 16. Data sampler block 20 provides deserializer 30 with W in-phase, or center, samples 24 of input serial data 22 taken using the W in-phase clocks 14. Data sampler block 20 also provides deserializer 30 with W quadrature, or edge, samples 26 of input serial data 22 taken using the W quadrature clocks 16.

Data sampler block 20 provides a clock signal 28 which operates at the baud rate of input serial data 22 divided by W. For W equal to two, clock 28 operates at half the baud rate of input serial data 22. For W equal to four, clock 28 operates at one quarter of the baud rate of input serial data 22. Clock 28 runs at approximately the same frequency as each of the individual in-phase clocks 14 and quadrature clocks 16, and triggers deserializer 30 to act on the samples 24 and 26. When deserializer 30 receives a positive transition of clock signal 28, the transition indicates to the deserializer that a sample of input serial data 22 has been taken with each of the in-phase clocks 14 and quadrature clocks 16. Deserializer 30 caches, or otherwise acts on, the W center data samples 24 and the W edge samples 26 at each positive transition of clock signal 28 before data sampler 20 resamples input serial data 22 using the next positive transition of each in-phase clock 14 and quadrature clock 16.

Proportional feedback path 40 receives a data bus of K center data samples 34 and K edge samples 36 from deserializer 30. Deserializer 30 generates a clock 38 which has a frequency equivalent to the baud rate of input serial data 22 divided by K. After deserializer 30 populates data buses 34-36 with K center data samples and K edge samples by concatenating multiple W center data samples 24 and W edge samples 26 in parallel, the deserializer generates a rising or positive transition of clock 38 to trigger proportional feedback path 40 to act on the data samples 34-36.

The number K represents the number of samples transferred from deserializer 30 to proportional feedback path 40 at one time. K can be the same number as W, or K can be a larger number than W. When K is equivalent to W, deserializer 30 simply forwards data bus 24 to proportional feedback path 40 as center data samples 34, data bus 26 as edge samples 36, and clock 28 as clock 38. In cases where K is larger than W, deserializer 30 caches center data samples 24 and edge samples 26 upon a positive transition of clock 28. Deserializer 30 then generates a transition of clock signal 38 when the cached samples add up to K. In some embodiments, K is a smaller number than W. K is a smaller number than W in embodiments where W is large and not all of the W samples 24 and W samples 26 are required or desired to be used for proportional feedback path 40 to generate phase error signal 42. With K smaller than W, clock 38 operates at the same rate as clock 28, and deserializer only forwards a subset of samples 24 and 26 to proportional feedback path 40.

As an example, with W equal to two and K equal to four, deserializer 30 stores a first set of samples 24-26 in a cache on a first positive transition of clock signal 28. Upon a second positive transition of clock signal 28, deserializer 30 generates a positive transition of clock signal 38 and forwards the cached first set of samples concatenated with a second set of samples 24-26 as center data samples 34 and edge samples 36 to proportional feedback path 40. The positive edge of clock 38 causes proportional feedback path 40 to calculate phase error signal 42 before a third positive transition of clock 28, when deserializer 30 caches a third set of samples 24-26 which overwrites the cached first set of samples. A fourth positive transition of clock 28 results in deserializer 30 generating a second positive transition of clock signal 38 and proportional feedback path 40 acts on third and fourth samples 24-26 received via data buses 34-36.

Proportional feedback path 40 generates phase error signal 42 which signifies whether the most recent samples of data sampler block 20 occurred early or late relative to the signal of input serial data 22. Edge samples 26 should ideally be taken at exactly the edge between two data bits of input serial data 22. Proportional feedback path 40 analyzes the K center data samples 34 and K edge samples 36 to determine whether the edge samples are occurring early or late. If a value of an edge sample is different than the value of an immediately previous center data sample, the edge sample occurred after the actual edge of input serial data 22, and was thus late. If a value of a center data sample is different than the value of an immediately previous edge sample, that previous edge sample occurred before a corresponding edge of input serial data 22, and thus was early.

In one embodiment, phase error signal 42 is a two-bit bus, with one bit an early indicator and one bit a late indicator. For every positive transition of clock signal 38, proportional feedback path 40 evaluates the K center data samples 34 and K edge samples 36 and generates a pulse on either the down bit or up bit of phase error signal 42. Proportional feedback path 40 generates a pulse of the down bit of phase error signal 42 if the K center data samples 34 and K edge samples 36 as a whole indicate clocks 14-16 are early relative to input serial data 22. Proportional feedback path 40 generates a pulse of the up bit of phase error signal 42 if the K center data samples 34 and K edge samples 36 as a whole indicate clocks 14-16 are late relative to input serial data 22. Proportional feedback path 40 may not generate any pulse of phase error signal 42 if no transitions of input serial data 22 between binary values occurred during the time period when samples 34-36 were taken by data sampler block 20.

Deserializer 30 caches the W center data samples 24 and W edge samples 26 into N parallel center data samples 44 and M parallel edge samples 46 which are routed to integral feedback path 50. Deserializer 30 also generates a clock signal 48 which is equivalent to the baud rate of input serial data 22 divided by N. Deserializer 30 caches the W center data samples 24 and W edge samples 26 at each rising transition of clock signal 28 to form the N center data samples 44 and M edge samples 46, similar to how samples 34-36 are formed. After enough samples 24-26 are received by deserializer 30 to form samples 44-46, the deserializer 30 generates a rising transition of clock signal 48 to trigger integral feedback path 50 to act on the samples 44-46.

In addition, the N data samples 44 and clock signal 48 are routed as outputs of the circuit module of CDR 10. An engineer designing a board or chip utilizing CDR 10 routes center data samples 44 to a FIFO, cache, or other memory element, and clock signal 48 is routed to control the storage of data samples 44 into the memory element. Data samples 44 represent the actual data content received at input serial data 22. The memory element external to CDR 10 stores data samples 44 at each positive transition of clock 48 for further use by a digital processor, ASIC, FPGA, or other circuit module that needs to receive data via an optical signal.

Integral feedback path 50 generates frequency error signal 52 using a digital accumulator to track the early and late samples of input serial data 22 over time. Frequency error signal 52 is a digital integral value that rises and falls as clocks 14 and 16 drift relative to input serial data 22. In some embodiments, frequency error signal 52 is output as a reflected binary code, or Gray code. A Gray code is a binary numeral system where two successive values differ by only one bit. If the N center data samples 44 and M edge samples 46 as a whole indicate that the edges of clocks 14-16 are early relative to input serial data 22, the value of the accumulator in integral feedback path 50 is reduced. If the N center data samples 44 and M edge samples 46 as a whole indicate that the edges of clocks 14-16 are late relative to input serial data 22, the value of the accumulator in integral feedback path 50 is increased. In some embodiments, late samples reduce the accumulator value while early samples increase the accumulator value. The bit width of the accumulator in integral feedback path, and thus the bit width of frequency error signal 52, is different in various embodiments. The bit width of frequency error signal 52 may be set based on a desired resolution, or step size, of integral feedback path 50.

Various methods are used to determine the number that is added to or subtracted from the accumulator in integral feedback path 50. Integral feedback path 50 subtracts the number of early edge samples from the number of late edge samples and adds the result to the accumulator. If the samples indicate an early sampling, the result is negative and the accumulator value is reduced. In one embodiment, the result of the comparison between early samples and late samples is reduced by a factor of 1, 2, 4, 8, 16, or any other number. Reducing the result by a factor which is a power of two provides the simplest implementation, but the result can be reduced by a factor that is not a power of two. In other embodiments, a majority vote is used among the samples. If more samples indicate that clocks 14-16 are early, the accumulator is reduced by a fixed amount. If more samples indicate that clocks 14-16 are late, the accumulator is increased by a fixed amount.

Clock generation block 12 receives phase error signal 42, a two-bit signal comprising a down bit and an up bit, and frequency error signal 52, a multiple bit signal representing a binary integer value. Clock generation block 12 modifies the phasing or frequency of in-phase clocks 14 and quadrature clocks 16 as necessary to improve the synchronization between clocks 14-16 and input serial data 22.

Reference clock 58 is routed to clock generation block 12. Reference clock 58 is at a known integer ratio of the input serial data 22 baud rate, i.e., a frequency near an integer sub-harmonic of the expected baud rate of input serial data 22. Clock generation block 12 uses reference clock 58 during calibration to quickly sync clock signals 14-16 as a whole to near the baud rate of input serial data 22. After calibration is complete, and during data transfer, reference clock 58 is not required or used. Clock generation block 12 syncs to input serial data 22 without reference clock 58. Reference clock 58 is optional, and clock generation block 12 syncs to input serial data 22 without the reference clock. However, reference clock 58 allows quicker frequency lock.

CDR 10 reduces the cost of receiving high frequency serial data because proportional feedback path 40 and integral feedback path 50 operate on parallelized data. Deserializer 30 allows the circuitry of feedback paths 40 and 50 to operate at significantly reduced clock frequencies relative to input serial data 22. In particular, operating the adders and accumulator of integral feedback path 50 at a clock rate reduced by a factor of N eases design constraints of the circuits. The lower operating frequency of proportional feedback path 40 and integral feedback path 50 allows CDR 10 to be fabricated using methods that reduce costs. Moreover, clock generation block 12 is able to shift in-phase clocks 14 relative to quadrature clocks 16. Shifting in-phase clocks 14 allows data sampler 20 to sample input serial data 22 at the highest margin location between two edges of the input serial data while still sampling with the quadrature clock at or near the edges of the input serial data.

Figure 2A:
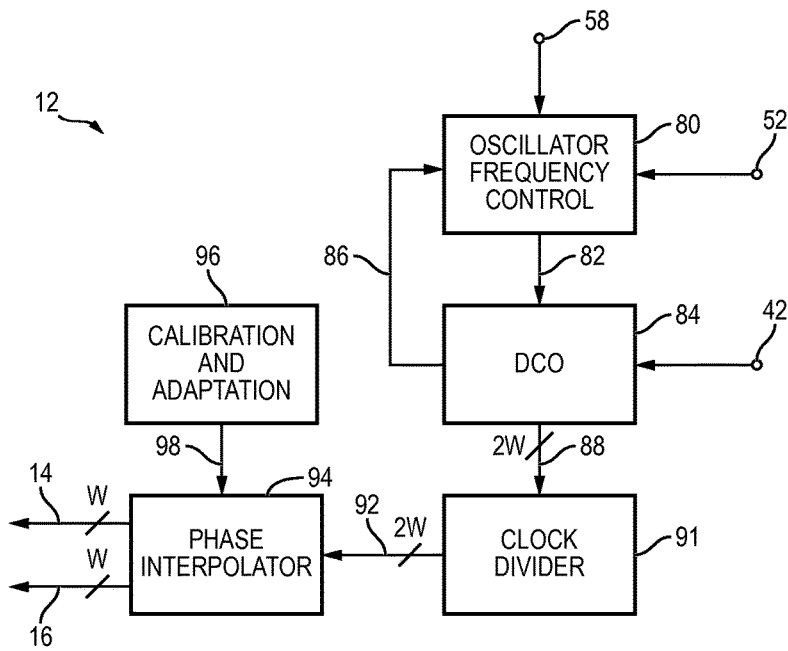
FIGS. 2a-2f illustrate a clock generation block of the CDR circuit.

FIG. 2a illustrates detail of clock generation block 12. Frequency error signal 52 is input to oscillator frequency control 80 from integral feedback path 50. Oscillator frequency control 80 outputs a frequency control signal 82 to digitally controlled oscillator (DCO) 84. DCO 84 receives phase error signal 42 from proportional feedback path 40. DCO 84 returns a calibration clock 86 to oscillator frequency control 80, and also generates 2W clock signals 88 to optional clock divider 91. Clock divider 91 reduces the frequency of clock signals 88 as required or desired in some embodiments, and outputs 2W clock signals 92 to phase interpolator block 94. Phase interpolator block 94 outputs W in-phase clocks 14 and W quadrature clocks 16. Calibration and adaption block 96 outputs a control signal 98 used to shift the quadrature clocks 16 relative to the in-phase clocks 14 using various methods to be explained below.

Oscillator frequency control 80 modifies the frequency of clock signals 88 using frequency control signal 82. Control signal 82 is a data bus with multiple binary digits that each control a switchable capacitive element within DCO 84 to tune an oscillator within the DCO. In one embodiment, control signal 82 is simply a binary numeral that is used by DCO 84 to tune itself through any number of varactors and switched capacitors. In other embodiments, a voltage controlled oscillator (VCO) is used instead of DCO 84, and control signal 82 is an analog voltage that controls the frequency of clock signals 88. One embodiment of DCO 84 uses a ring-oscillator core. Another embodiment of DCO 84 uses an inductor-capacitor (LC) based VCO.

During calibration, oscillator frequency control 80 compares the frequency of reference clock 58 to calibration clock 86 from DCO 84 to generate control signal 82. Clock generation block 12 synchronizes the frequency of clock signals 14-16 to reference clock 58 during calibration, then uses frequency error signal 52 to synchronize clocks 14-16 with input serial data 22 during normal operation. After calibration, reference clock signal 58 and calibration clock 86 are generally not used unless recalibration is required.

DCO 84 includes a single oscillator to generate 2W clock signals 88. A frequency of the oscillator in DCO 84 is controlled by control signal 82 from oscillator frequency control 80. Delay logic within DCO 84 is used to output 2W clock signals 88 at different phases. In other embodiments, clock signals 88 are output in phase, and phase interpolator block 94 is relied upon to introduce the entire delay between each of the in-phase clocks 14 and quadrature clocks 16. The delay logic is further controlled based upon phase error signal 42 to introduce or remove delay from each clock 88 in unison. Clock divider 91 is optionally used to reduce the frequency of clock signals 14-16 for use with an input serial data 22 having a different data rate.

Phase interpolator block 94 accepts 2W clocks 92 as inputs and generates W in-phase clocks 14 and W quadrature clocks 16 as outputs. Phase interpolator block 94 outputs each in-phase clock signal 14 to be halfway between two adjacent quadrature clock signals 16. Phase interpolator block 94 also outputs each quadrature clock signal 16 to be halfway between two adjacent in-phase clock signals 14. In some embodiments, calibration and adaptation block 96 uses interpolator control signal 98 to shift quadrature clocks 16 relative to in-phase clocks 14 so that data sampler block 20 takes center data samples near the optimal time in the eye pattern of input serial data 22.

In-phase clocks 14 and quadrature clocks 16 include phases that are evenly spaced throughout one period of the clocks such that one in-phase clock and one quadrature clock have rising transitions for each bit period of input serial data 22. If the period of clocks 14-16 is considered to be 360 degrees, and W is equal to two, then the two in-phase clocks 14 have rising transitions at 0 degrees and 180 degrees while the two quadrature clocks have rising edges at 90 degrees and 270 degrees. With W equal to four, one individual in-phase clock 14 has a rising transition at each of 0, 90, 180, and 270 degrees. The individual quadrature clocks have rising transitions at 45, 135, 225, and 315 degrees with W equal to four. Calibration and adaptation block 96 causes a shift in the in-phase clocks 14 relative to quadrature clocks 16 using signal 98. For W equal to two, rising transitions of in-phase clocks 14 are shifted away from occurring at 0 and 180 degrees in cases where input serial data 22 has a higher margin earlier or later in the eye pattern of the serial data. Quadrature clocks 16 remain at approximately 90 and 270 degrees because the cycle is defined relative to edges of input serial data 22, and quadrature clocks 16 should always occur near the edges between subsequent data bits of the input serial data.

Figure 2B:
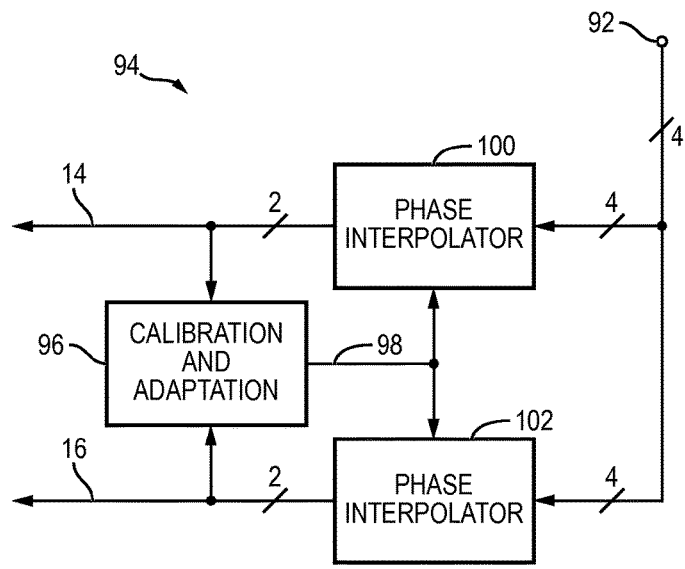

FIG. 2b illustrates one embodiment of phase interpolator block 94 when W is equal to two. W clock signals 92 from DCO 84 are routed to mini phase interpolator 100 and mini phase interpolator 102. Mini phase interpolators are used for interpolators 100 and 102 which only include an adjustment range of +/−90 degrees, but include a reduced circuit footprint relative to 360 degree adjustable phase interpolators. In some embodiments, full sized and full range phase interpolators are used. Phase interpolator 100 generates two in-phase clock signals 14. Phase interpolator 102 generates two quadrature clock signals 16. In embodiments where W is equal to four, four phase interpolators are used. Each phase interpolator receives four of the eight total clock signals 92 and outputs two clock signals 14 or two clock signals 16. Two of the four phase interpolators each outputs two of the four total in-phase clocks 14. The two other phase interpolators each outputs two of the four total quadrature clocks 16.

Calibration and adaptation block 96 controls delay of the mini phase interpolators 100 and 102 to adjust where the in-phase clocks 14 occur relative to quadrature clocks 16. In one embodiment, calibration and adaptation block 96 is simply an IQ detector that receives clocks 14-16 and adjusts phase interpolators 100-102 until each clock is spread out evenly across a full clock cycle. In other embodiments, an eye monitor is used that observes input serial data 22 and shifts in-phase clocks 14 to maximize the margin of samples taken by data sampler block 20.

In some embodiments, CDR 10 calibrates phase interpolators 100-102 by providing input serial data 22 as a square wave at a frequency slightly offset from the frequency of DCO 84. During the calibration process, the data samples 24 and edge samples 26 are expected to be high, or binary one, half of the time, and therefore low, or binary zero, half the time. The numbers of high versus low samples are analyzed to sense the relative spacing of in-phase clocks 14 and quadrature clocks 16, and determine a better setting for the mini phase interpolators 100-102. Calibrating phase interpolators 100-102 in the above manner compensates for mismatches between samplers in data sampler block 20 using in-phase clocks 14 and samplers using quadrature clocks 16.

Figure 2C:
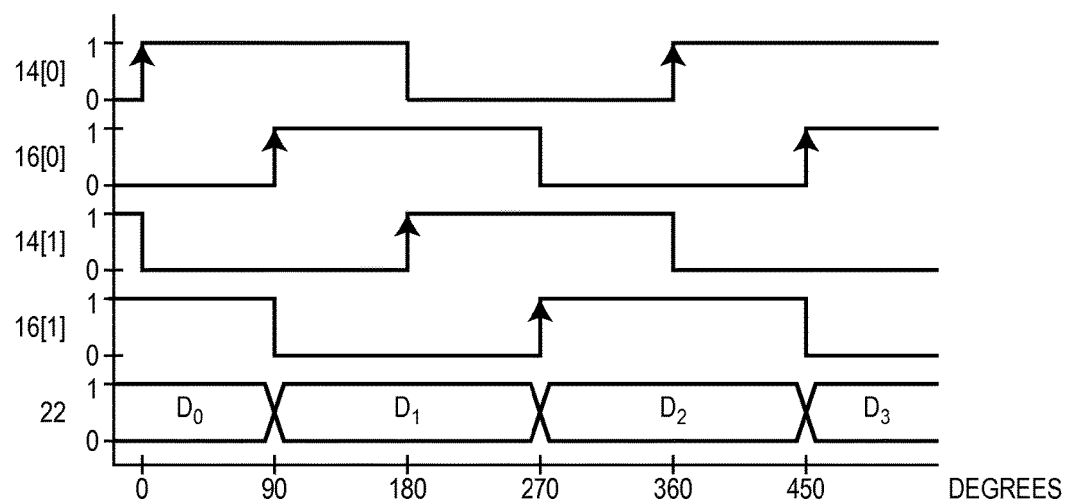

FIG. 2c illustrates a timing diagram of clocks 14-16 and input serial data 22 when W is equal to 2. The two in-phase clocks 14 are designated as clock 14[0] and clock 14[1]. The two quadrature clocks 16 are designated as clock 16[0] and clock 16[1]. In-phase clock 14[0] has a rising transition at 0 degrees. The rising transition of clock 14[0] triggers data sampler block 20 to sample a first data bit ($D_0$) of input serial data 22. Clock 16[0] has a rising transition at 90 degrees that triggers data sampler block 20 to sample an edge of input serial data 22 between $D_0$ and a second data bit ($D_1$).

Input serial data 22 is illustrated as a series of eye patterns with edges at 90, 270, and 450 degrees. Each of the illustrated data bits $D_0$-$D_3$ could potentially be a binary zero or a binary one. If $D_0$ is a binary zero, and $D_1$ is a binary one, then the data edge at 90 degrees is a rising transition. If $D_0$ is a binary one, and $D_1$ is a binary zero, then the data edge at 90 degrees is a falling transition. If both $D_0$ and $D_1$ are the same value, either binary one or binary zero, then no transition is observed at 90 degrees. Input serial data 22 remains a straight line from zero degrees until the next potential transition at 270 degrees.

If $D_0$ is different than $D_1$, the sample taken with clock 16[0] at 90 degrees will indicate the timing, either early or late, of clock 16[0]. If clock 16[0] is early, the sample taken by data sampler block 20 using clock 16[0] will be the same as $D_0$. If clock 16[0] is late, the sample using clock 16[0] will be the same as $D_1$. If $D_0$ is the same value as $D_1$, then no actual transition is observed in input serial data 22, and the early or late status of clock signal 16[0] cannot be discerned. Clock 14[1] causes data sampler block 20 to sample $D_1$ at 180 degrees, and clock 16[1] samples an edge of the input serial data between $D_1$ and a third data bit ($D_2$) at 270 degrees. Then data sampler block 20 generates a rising transition of clock signal 28 to indicate to deserializer 30 that all W center data samples 24 and W edge samples 26 have been taken. In one embodiment, clock 16[1] is used to generate clock 28 because clock 16[1] is the last of clocks 14-16 to transition. The cycle starts over again with clock 14[0] having another rising transition at 360 degrees, i.e., 0 degrees of the next cycle.

Figure 2D:
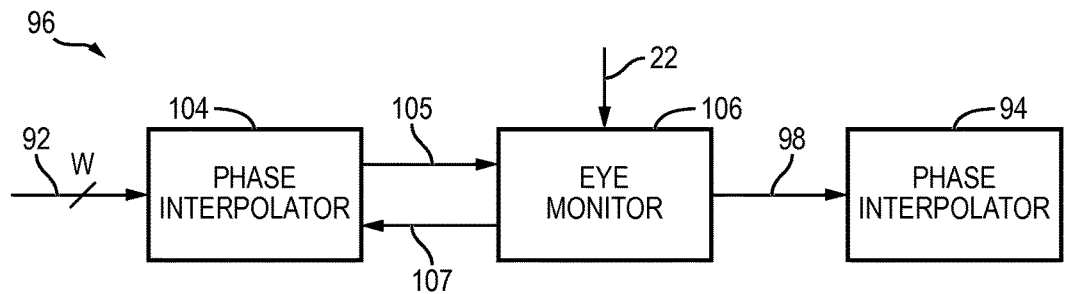

FIG. 2d illustrates eye monitor 106 of calibration and adaption block 96 which is used to adjust the relative phases of in-phase clocks 14 and quadrature clocks 16 in some embodiments. A full range phase interpolator 104 receives the 2W clock phases 92 from DCO 84 and outputs 2W evenly spaced clock signals 105 to eye monitor 106. Eye monitor 106 monitors input serial data 22 and uses control signal 107 to adjust the quadrature clocks of clock signals 105 relative to the in-phase clocks of clock signals 105. As the phases of clocks 105 are adjusted, eye monitor 106 observes the difference between the power level of a binary zero and a binary one on input serial data 22. Eye monitor 106 adjusts the relative phases of in-phase and quadrature clocks of clock signals 105 until a maximum margin between binary input values is observed. Eye monitor 106 then uses phase interpolator signal 98 to adjust phase interpolators 100 and 102 of phase interpolator 94 accordingly.

In one embodiment, CDR 10 initially calibrates phase interpolators 100 and 102 by providing input serial data 22 as a clock signal and comparing low and high samples of center data 44. CDR 10 then continues adjusting or adapting phase interpolators 100 and 102 using eye monitor 106 as data is received. Various factors, including intersymbol interference and channel noise, affect the actual rise or fall trajectory of input serial data 22. Eye patterns of input serial data 22 may change over time, and eye monitor 106 periodically adjusts phase interpolator 94 as changes are detected by phase interpolator 104 and eye monitor 106.

Figure 2E:
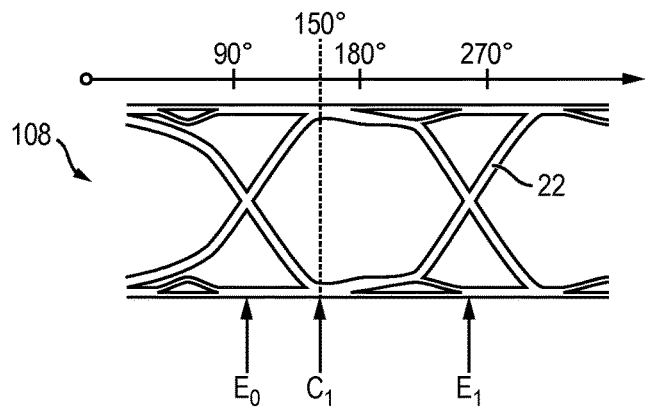
Figure 2F:
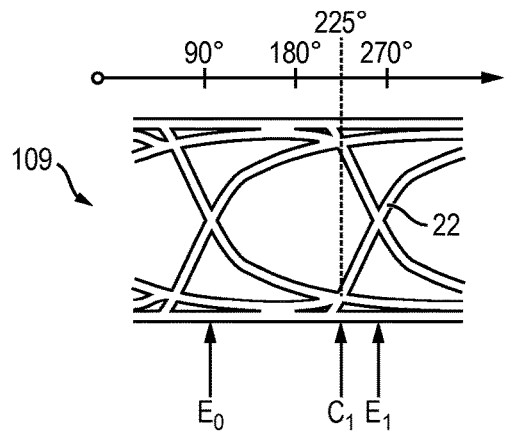

The eye pattern of a serial data signal represents how the signal looks on an oscilloscope display. An eye pattern shows multiple superimposed transitions, so that an observer gets a picture of the average positive and negative transition paths. FIG. 2e illustrates eye pattern 108. Eye pattern 108 includes edge $E_0$ at 90 degrees and edge $E_1$ at 270 degrees. By default, data sampler block 20 takes a center data sample ($C_1$) at 180 degrees, i.e., halfway between edges $E_0$ and $E_1$. However, eye pattern 108 is vertically widest at 150 degrees. The difference between the power levels of a binary zero value and a binary one value of input serial data 22 is greatest at 150 degrees. Using eye monitor 106 to adjust in-phase clocks 14 to occur earlier in the data cycle increases the likelihood that data sampler block 20 will be able to accurately discern binary one values from binary zero values of input serial data 22. FIG. 2f illustrates eye pattern 109. Eye pattern 109 is similar to eye pattern 108, but includes an optimal sample time at 225 degrees. Eye monitor 106 adjusts clocks 105 to discover the optimal center data sample time relative to the signal edges, and uses phase interpolator adjust signal 98 to adjust phase interpolators 100 and 102 accordingly.

Figure 3:
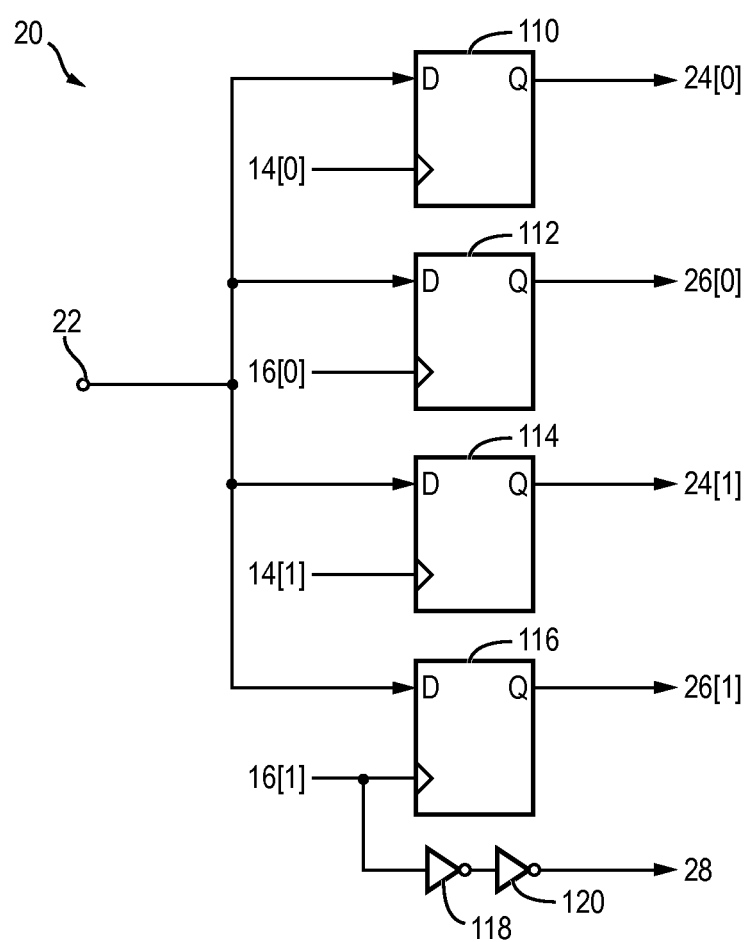
FIG. 3 illustrates a data sampler block of the CDR circuit.

FIG. 3 illustrates data sampler block 20 of CDR 10 with W equal to two. Data sampler block 20 receives two in-phase clocks, 14[0] and 14[1], as well as two quadrature clocks, 16[0] and 16[1]. Input serial data 22 is routed to data sampler block 20 from a transmit source. In one embodiment, an optical signal from a transmit source is routed to a photo diode, which generates a corresponding electrical signal that is routed to data sampler block 20 as input serial data 22. Flip-flops 110-116 sample input serial data 22 based on clocks 14-16 to generate data samples 24-26. Inverters 118 and 120 introduce a delay between clock 16[1] and clock 28 to ensure that the output of flip-flop 116 is setup before clock 28 is received by deserializer 30. In some embodiments, data sampler block 20 includes a decision feedback equalizer (DFE) to reduce the effects of intersymbol interference on data samples.

Each of flip-flops 110-116 receives a digital input signal at data input terminals marked with the letter D in FIG. 3, and an input clock signal at clock input terminals marked with a triangle. At every rising transition of the input clock signal, a binary value at the data input is transferred and stored to a data output of the flip-flop, marked with the letter Q. The data output of the flip-flop is held static until a subsequent rising transition of the clock signal results in another transfer and storage of another input data bit (D) to the output data terminal (Q).

Flip-flop 110 copies input serial data 22 to in-phase sample 24[0] at each rising transition of in-phase clock 14[0]. Flip-flop 110 stores the value of in-phase sample 24[0] until a subsequent rising transition of in-phase clock 14[0] causes flip-flop 110 to store a new sample of input serial data 22. The new sample could be the same binary value as the old sample, in which case no transition is observed at sample output 24[0]. Flip-flop 112 copies a value from input serial data 22 to quadrature sample 26[0] at every rising transition of quadrature clock 16[0]. Flip-flop 114 copies a value from input serial data 22 to in-phase sample 24[1] at every rising transition of in-phase clock 14[1]. Flip-flop 116 copies a value from input serial data 22 to quadrature sample 26[1] at every rising transition of quadrature clock 16[1].

With W equal to four, data sampler block 20 uses four flip-flops to create center data samples 24[0], 24[1], 24[2], and 24[3] based on in-phase clocks 14[0]-14[3], and four flip-flops to create edge samples 26[0]-26[3] based on quadrature clocks 16[0]-16[3]. In general, data sampler block 20 uses 2W flip-flops to create W center data samples 24 and W edge samples 26 based on W in-phase clocks 14 and W quadrature clocks 16.

Inverters or buffers 118 and 120 introduce a delay between quadrature clock 16[1] and clock signal 28. The delay of inverters 118 and 120 is provided so that the value of input serial data 22 at the data input of flip-flop 116 has time to propagate through to edge sample 26[1] before deserializer 30 receives the rising transition of clock signal 28. A different number of inverters is used in some embodiments depending on the propagation timing of flip-flop 116. In other embodiments, different methods of generating clock signal 28 are used.

Figure 4:
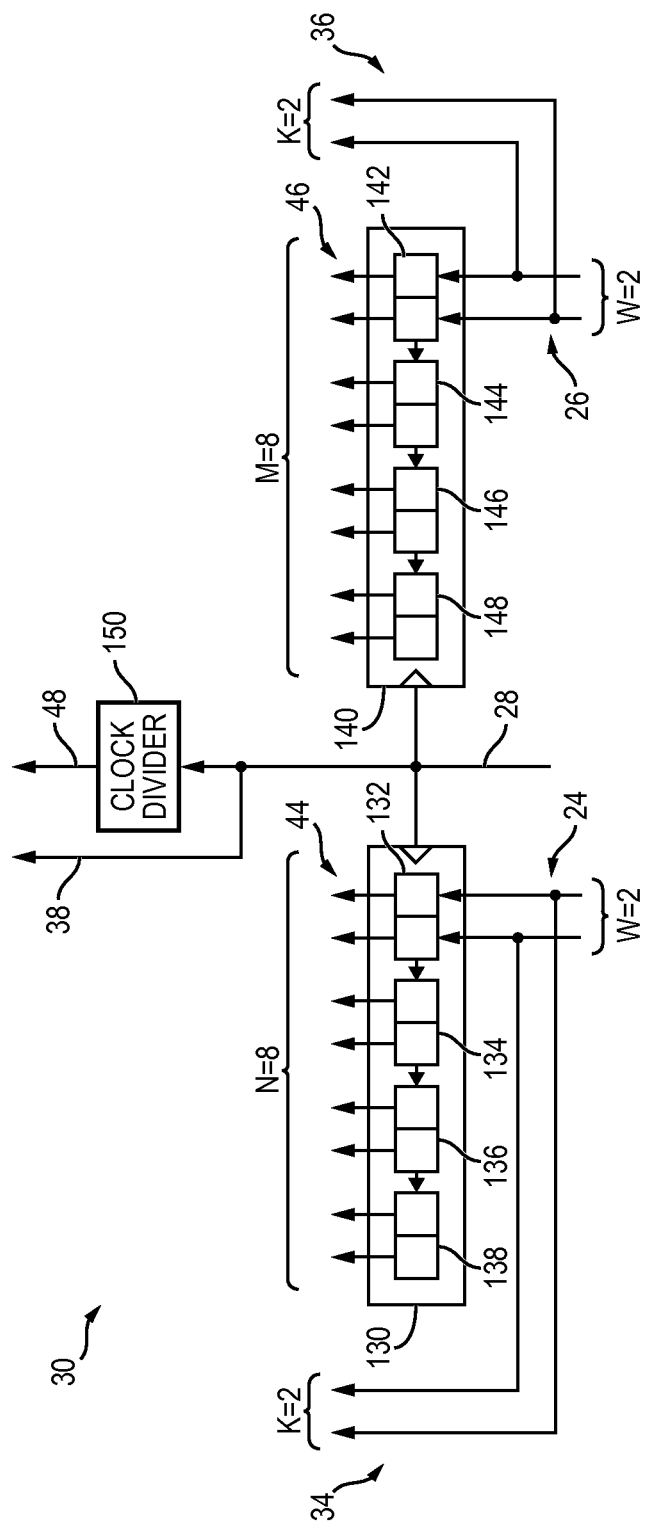
FIG. 4 illustrates a deserializer of the CDR circuit.

FIG. 4 illustrates an embodiment of deserializer 30 with K and W both equal to two, and N and M each equal to eight. Center data samples 24 are routed to proportional feedback path 40 as center data samples 34. Edge samples 26 are routed to proportional feedback path 40 as edge samples 36. Clock 28 is routed to proportional feedback path 40 as clock 38. Because the width of data used by proportional feedback path 40, K, is equal to W, proportional feedback path 40 is capable of using center data samples 24, edge samples 26, and clock 28 without further deserialization. The clock speed of proportional feedback path 40 is the same as each individual flip-flop of data sampler block 20. More generally, the clock frequency of clock signal 38 used by proportional feedback path 40 is the frequency of clock signal 28 multiplied by W/K when K is greater than W.

On the other hand, the embodiment of FIG. 4 has both N and M equal to eight. That is, integral feedback path 50 operates on eight center data samples 44 and eight edge samples 46 at a time. In other embodiments, N and M are greater than eight, e.g., sixteen, twenty, thirty-two, or sixty-four. Clock signal 48 used by the circuitry of integral feedback path 50 operates at one quarter of the frequency of each individual sampler because N is four times W. More generally, the clock frequency of clock signal 48 used by integral feedback path 50 is the frequency of clock signal 28 multiplied by W/N.

Shift register 130 is used by deserializer 30 to generate the eight-bit wide center data samples 44 from the two-bit wide center data samples 24. Shift register 130 includes four pairs of bits 132-138, which are each capable of storing one set of center data samples 24. The pairs of bits 132-138 are output in parallel to integral feedback path 50 as center data samples 44. Shift register 140 is used by deserializer 30 to generate the eight-bit wide edge samples 46 from the two-bit wide edge samples 26. Shift register 140 includes four pairs of bits 142-148, which are each capable of storing one set of edge samples 26. The pairs of bits 142-148 are output in parallel to integral feedback path 50 as edge samples 46. Clock divider 150 is a 1:4 divider that generates clock 48 at one quarter of the clock frequency of clock 28.

Shift register 130 receives and operates based on clock 28. At each rising transition of clock signal 28, the two bits of center data samples 24 are stored into bits 132 of shift register 130. The two bits previously stored in bits 132 are shifted to bits 134. The two bits previously stored in bits 134 are shifted to bits 136. The two bits previously stored in bits 136 are shifted to bits 138. The two bits that were previously stored in bits 138 are discarded. Every four clock cycles of clock 28, four new sets of center data samples 24 have been stored in shift register 130. Clock divider 150 generates a rising transition of clock 48 to trigger integral feedback path 50 to operate on the eight center data samples 44. Then, over the next four clock cycles of clock 28, the old samples are shifted out of shift register 130 and eight new bits of center data samples 24 are stored in bit pairs 132-138.

Shift register 140 operates similarly to shift register 130. Edge samples 26 are shifted into bit pair 142 to bit pair 144, bit pair 146, and bit pair 148. Four new sets of edge samples 26 are stored at the same time as four new center data samples 24 are stored in shift register 130, so the same transition of clock 48 triggers integral feedback path 50 to operate on both center data samples 44 and edge samples 46.

In some embodiments, the bit-width of edge samples 46, M, is less than the bit-width of center data samples 44, N. M is a lower number than N in embodiments where only a subset of edge samples are used by integral feedback path 50 to update frequency error signal 52. Only the edge samples needed to perform the calculation are sent to integral feedback path 50. Each sampled data bit is generally part of center data samples 44 because the N center data samples are stored in memory as the received data for use by the operating system or other software or hardware applications of a system including CDR 10. In embodiments where the bit-width of edge samples 46, M, is lower than the bit-width, N, of center data samples 44, an optional edge mute control signal is utilized to prevent operation of shift register 140 for some positive transitions of clock signal 28.

Figure 5A:
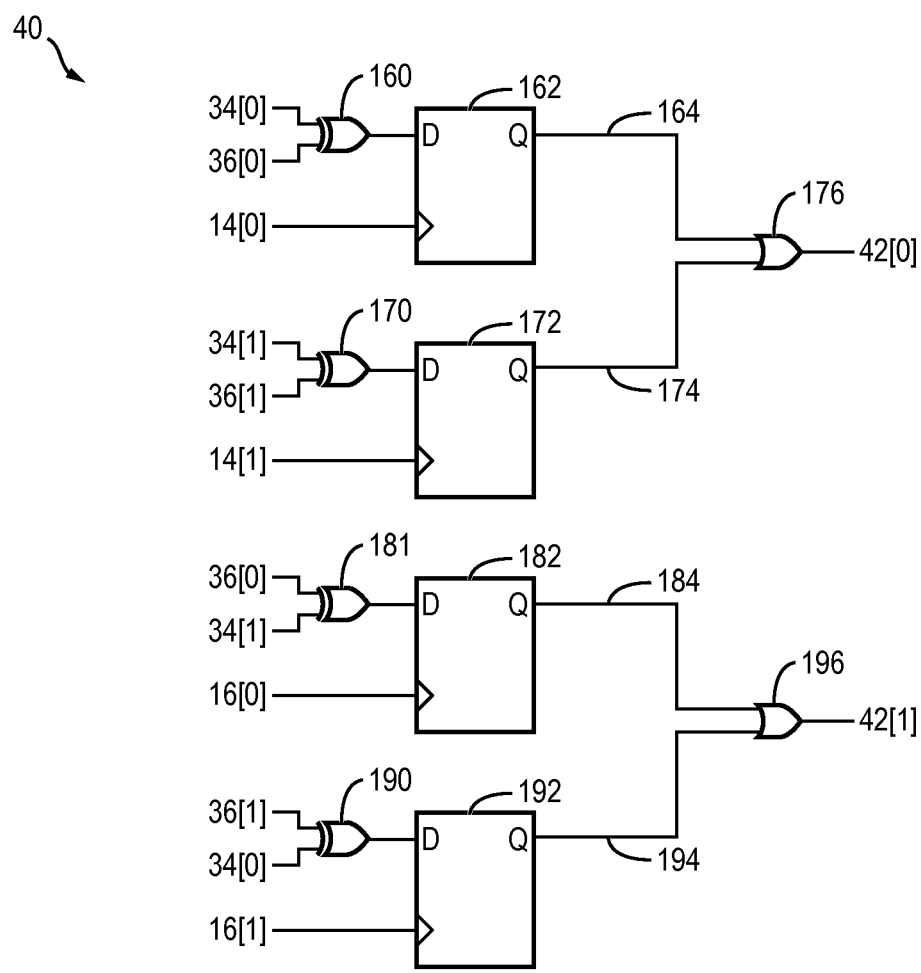
FIGS. 5a-5i illustrate a proportional feedback path of the CDR circuit.

FIG. 5a illustrates proportional feedback path 40 in an embodiment with K equal to 2. Center data samples 34[0] and 34[1] can be the same signal as any two center data samples 24. Edge samples 36[0] and 36[1] can be the same as any two edge samples 26. The four clock signals 14-16 are used because proportional feedback path 40 operates at the same speed as data sampler block 20. In some embodiments, where deserialized data is used for proportional feedback path 40, clock dividers are used to reduce the operating speed of the clocks. In other embodiments, proportional feedback path 40 operates using a single clock signal.

XOR gate 160 includes center data sample 34[0] and edge sample 36[0] as inputs, and generates an output to flip-flop 162. Flip-flop 162 samples the output of XOR gate 160 using in-phase clock signal 14[0] and outputs an up signal 164. XOR gate 170 includes center data sample 34[1] and edge sample 36[1] as inputs, and generates an output to flip-flop 172. Flip-flop 172 samples the output of XOR gate 170 using in-phase clock signal 14[1] and outputs an up signal 174. OR gate 176 outputs a binary one value on phase error signal 42[0] if either up signal 164 or up signal 174 is a binary one value. Up signals 164 and 174 include a binary one value if clocks 16 are late relative to the edges of input serial data 22. Up signals 164 and 174 include a binary zero value if clocks 16 are not late relative to the edges of input serial data 22.

XOR gate 181 includes edge sample 36[0] and center data sample 34[1] as inputs, and generates an output to flip-flop 182. Flip-flop 182 samples the output of XOR gate 181 using quadrature clock signal 16[0] and outputs a down signal 184. XOR gate 190 includes edge sample 36[1] and center data sample 34[0] as inputs, and generates an output to flip-flop 192. Flip-flop 192 samples the output of XOR gate 190 using quadrature clock signal 16[1] and outputs a down signal 194. OR gate 196 outputs a binary one value on phase error signal 42[1] if either down signal 184 or down signal 194 is a binary one value. Down signals 184 and 194 include a binary one value if clocks 16 are early relative to the edges of input serial data 22. Down signals 184 and 194 include a binary zero value if clocks 16 are not early relative to the edges of input serial data 22. Phase error signal bits 42[0] and 42[1] are routed to clock generation block 12.

Clock generation block 12 uses the up and down pulses of phase error signal 42 to adjust a delay in generating in-phase clocks 14 and quadrature clocks 16.

A two-input XOR gate, e.g., XOR gates 160, 170, 181, and 190, outputs a binary one value if the two inputs to the XOR gate are at different binary values. If a two-input XOR gate has both inputs at a binary one value, or both inputs at a binary zero value, the XOR gate outputs a binary zero value. Therefore, XOR gates 160, 170, 181, and 190 are used to determine if their respective inputs are the same or different binary values.

In particular, XOR gate 160 determines whether center data sample 34[0] is the same binary value as edge sample 36[0]. If the binary value of input serial data 22 changed between when data sampler block 20 took center data sample 34[0], and when the data sampler block took edge sample 36[0], then clock signal 16[0] is late. The transition of input serial data 22 occurred before the transition of quadrature clock signal 16[0], which is the clock signal used to take edge sample 36[0]. A rising transition of clock signal 14[0] causes the binary one value output by XOR gate 160 to be latched by flip-flop 162. Therefore, up signal 164 and phase error signal 42[0] will include a binary one value at least until the next positive transition of clock signal 14[0]. XOR gate 170 operates similarly to XOR gate 160, except that XOR gate 170 operates on center data sample 34[1] and 36[1]. XOR gate 170 determines the timing of quadrature clock 16[1] relative to the edge of input serial data 22 immediately after the edge analyzed by XOR gate 160.

XOR gate 181 determines whether edge sample 36[0] is the same as or different than center data sample 34[1]. If the binary value of input serial data 22 changed between when data sampler block 20 took edge sample 36[0] and when the data sampler block took center data sample 34[1], then clock signal 16[0] is early. The transition of input serial data 22 occurred after the transition of quadrature clock signal 16[0], which is the clock signal used to take edge sample 36[0]. A rising edge of clock signal 16[0] causes the binary one value output by XOR gate 181 to be latched by flip-flop 182. Therefore, down signal 184 and phase error signal 42[1] will include a binary one value at least until the next positive transition of clock signal 16[0]. XOR gate 190 operates similarly to XOR gate 181, except that XOR gate 190 compares edge sample 36[1] and center data sample 34[0]. XOR gate 190 determines the timing of quadrature clock 16[1] relative to the edge of input serial data 22 immediately after the edge analyzed by XOR gate 181.

In summary, flip-flop 162 generates a positive up signal 164 if quadrature clock 16[0] is late, while flip-flop 182 generates a positive down signal 184 if quadrature clock 16[0] is early. Flip-flop 172 generates a positive up signal 174 if quadrature clock 16[1] is late, while flip-flop 192 generates a positive down signal 194 if quadrature clock 16[1] is early. Up signals 164 and 174 are combined by OR gate 176 into a single up signal on phase error signal bit 42[0]. Down signals 184 and 194 are combined by OR gate 196 to create a down signal on phase error signal bit 42[1]. Phase error bits 42[0] and 42[1] are routed to DCO 84 in clock generation block 12 and control a delay in the generation of clock signals 14-16.

FIGS. 5b-5g illustrate example transitions between $D_0$ and $D_1$ of input serial data 22. In each of the FIGS. 5b-5g, a center data sample 34[0] is taken near the center of $D_0$, an edge sample 36[0] is taken near the transition between $D_0$ and $D_1$, and a second center data sample 34[1] is taken near the center of $D_1$. Proportional feedback path 40 compares the samples 34[0], 36[0], and 34[1] to determine whether the edge sample 36[0] was taken early or late compared to an actual transition between $D_0$ and $D_1$.

Input serial data 22 in FIGS. 5b-5h utilizes OOK or ASK encoding of data. Line 198 in FIGS. 5b-5g delineates between a binary zero value and a binary one value of input serial data 22. The power level of input serial data 22 is illustrated on the vertical axes of FIGS. 5b-5g. When the power level of input serial data 22 is above line 198, data sampler block 20 samples the input serial data as a binary one. When the power level of input serial data 22 is below line 198, data sampler block 20 samples the input serial data as a binary zero. In other embodiments, other encoding schemes besides on-off keying or amplitude-shift keying are used.

Figure 5B:
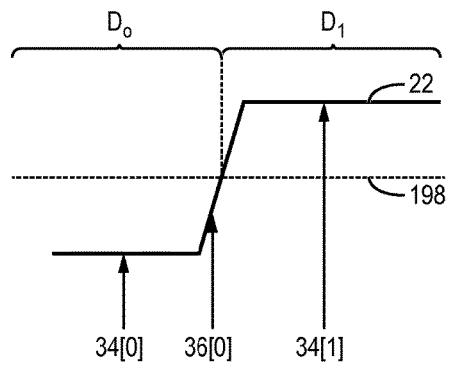
Figure 5C:
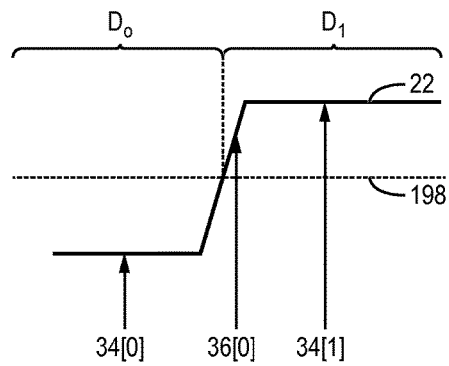

FIGS. 5b and 5c illustrate a rising transition of input serial data 22, with $D_0$ a binary zero value and $D_1$ a binary one. In FIG. 5b, sample 36[0] is taken early, i.e., before input serial data 22 has changed from a binary zero to a binary one. Samples 34[0] and 36[0] are taken by data sampler block 20 as binary zeros, while sample 34[1] is taken as a binary one. Applying the example of FIG. 5b to the circuit of FIG. 5a, XOR gate 160 compares sample 34[0] and sample 36[0], which are both binary zero, and outputs a binary zero value. Flip-flop 162 latches in a binary zero on the next rising transition of clock signal 14[0]. A binary zero output by flip-flop 162 at output 164 indicates a lack of an up pulse. Assuming up signal 174 is a binary zero as well, both inputs to OR gate 176 remain binary zero, and no up pulse is generated on phase error signal 42[0] to DCO 84. On the other hand, sample 36[0] is a binary zero while sample 34[1] is a binary one. XOR gate 181 outputs a binary one value because the values of the XOR gate inputs are different. Flip-flop 182 latches in the binary one value from XOR gate 181 at the next rising edge of clock signal 16[0] to generate a binary one at signal 184. OR gate 196 outputs a binary one at phase error signal bit 42[1]. DCO 84 receives phase error signal up bit 42[0] as a binary zero and down bit 42[1] as a binary one, and adds slightly to the delay used in generating clocks 14-16.

FIG. 5c is similar to FIG. 5b except that sample 36[0] is taken slightly after input serial data 22 transitions to a binary one value. In FIG. 5c, samples 36[0] and 34[1] are the same value, while sample 34[0] is a different value. XOR gate 160 outputs a binary one value due to the differing values of samples 34[0] and 36[0]. Flip-flop 162 latches the binary one from XOR gate 160 and generates a binary one value on signals 164 and 42[0]. XOR gate 181 outputs a binary zero value because samples 36[0] and 34[1] are the same binary value. Flip-flop 182 latches in the binary zero value, and signal 184 is a binary zero. Assuming output 194 of flip-flop 192 is a binary zero, phase error signal bit 42[1] to DCO 84 is a zero. DCO 84 receives up bit 42[0] as a binary one and down bit 42[1] as a binary zero, and slightly reduces the delay used in generating clocks 14-16.

Figure 5D:
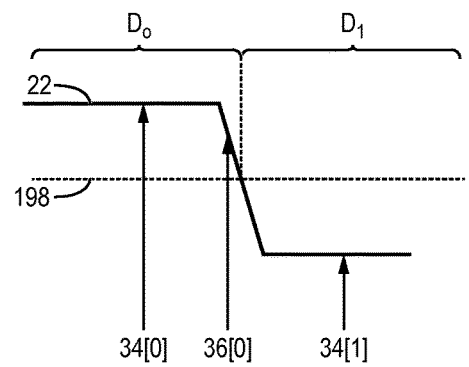
Figure 5E:
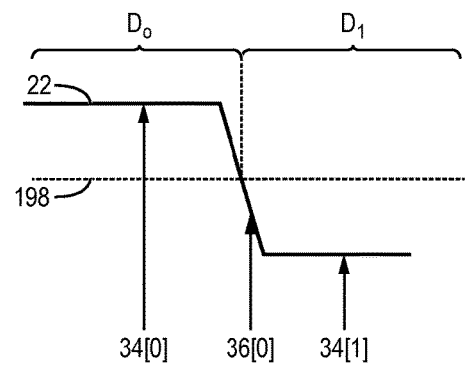

FIGS. 5d and 5e illustrate a falling transition of input serial data 22, with $D_0$ a binary one value and $D_1$ a binary zero. In FIG. 5d, sample 36[0] is taken early, i.e., while input serial data 22 is still a binary one value. Samples 34[0] and 36[0] are taken by data sampler block 20 as binary ones, while sample 34[1] is taken as a binary zero. Applying the example of FIG. 5d to the circuit of FIG. 5a, XOR gate 160 compares sample 34[0] and sample 36[0], which are both binary one, and outputs a binary zero value. Flip-flop 162 latches in a binary zero on the next rising transition of clock signal 14[0]. No up pulse is generated by flip-flop 162 at output 164. Assuming up signal 174 is a binary zero as well, both inputs to OR gate 176 remain binary zero, and no up pulse is generated on phase error signal 42[0] to DCO 84. On the other hand, sample 36[0] is a binary one while sample 34[1] is a binary zero. XOR gate 181 outputs a binary one value because the values of the XOR gate inputs are different. Flip-flop 182 latches in the binary one value from XOR gate 181 at the next rising edge of clock signal 16[0] to generate a binary one at signal 184. OR gate 196 outputs a binary one at phase error signal bit 42[1]. DCO 84 receives up bit 42[0] as a binary zero and down bit 42[1] as a binary one, and adds slightly to the delay used in generating clocks 14-16.

FIG. 5e is similar to FIG. 5d except that sample 36[0] is taken slightly after input serial data 22 transitions to a binary zero value. In FIG. 5e, samples 36[0] and 34[1] are the same value, while sample 34[0] is a different value. XOR gate 160 outputs a binary one value due to the differing values of samples 34[0] and 36[0]. Flip-flop 162 latches the binary one from XOR gate 160 and generates a binary one value on signals 164 and 42[0]. XOR gate 181 outputs a binary zero value because samples 36[0] and 34[1] are the same binary value. Flip-flop 182 latches in the binary zero value, and signal 184 is a binary zero. Assuming output 194 of flip-flop 192 is a binary zero, phase error signal bit 42[1] to DCO 84 is a zero. DCO 84 receives up bit 42[0] as a binary one and down bit 42[1] as a binary zero, and slightly reduces the delay used in generating clocks 14-16.

Figure 5F:
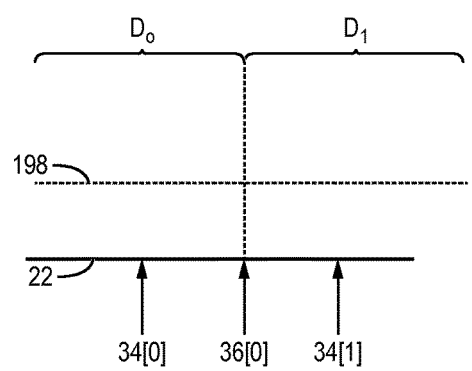
Figure 5G:
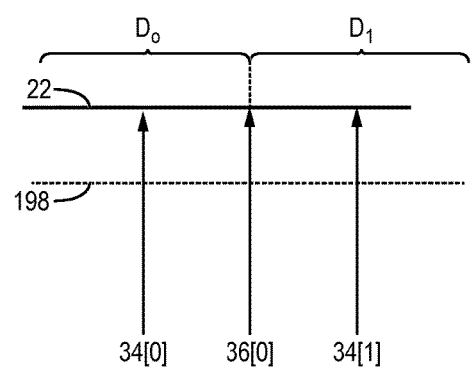

FIGS. 5f and 5g illustrate examples with $D_0$ and $D_1$ of input serial data 22 being the same binary value. In FIG. 5f, samples 34[0], 36[0], and 34[1] are all binary zero values. In FIG. 5g, samples 34[0], 36[0], and 34[1] are all binary one values. In either case, all three samples have the same binary value, and therefore both XOR gates 160 and 181 output binary zero values. Assuming that signals 174 and 194 are binary zero, both phase error bits 42 remain binary zero and DCO 84 makes no adjustment to the delay used in generating clocks 14-16.

Figure 5H:
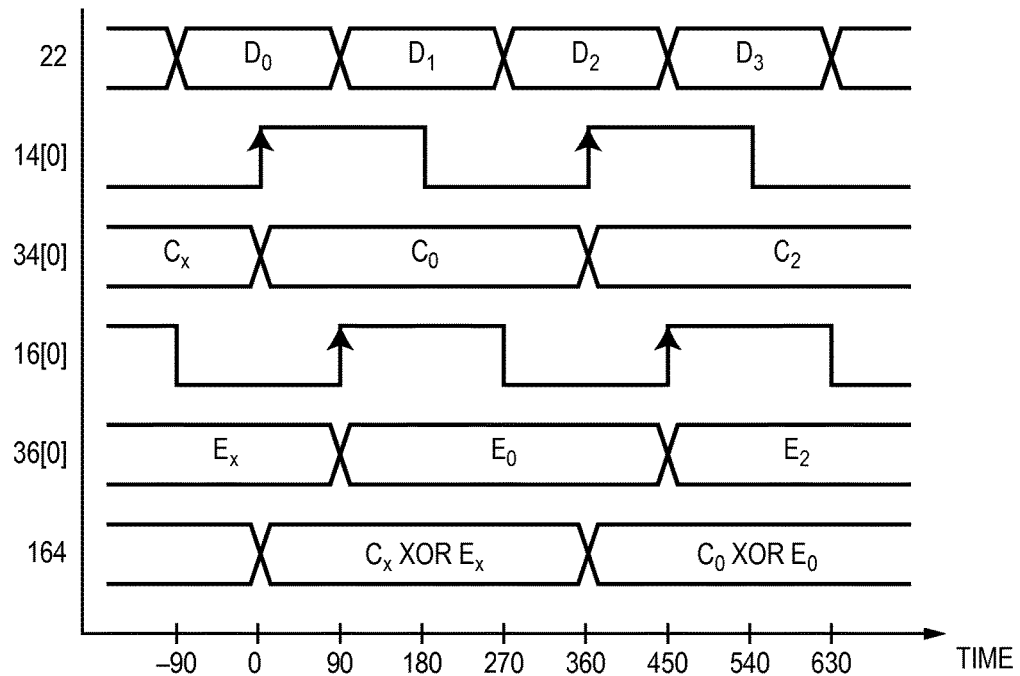
Figure 5I:
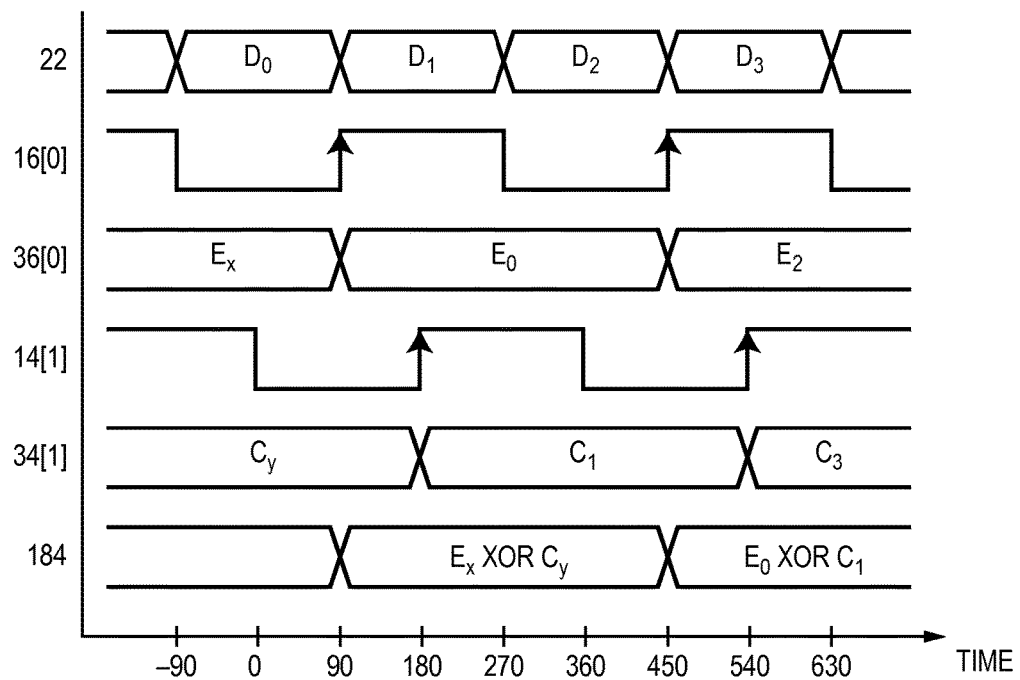

FIGS. 5h and 5i are timing diagrams of proportional feedback path 40 over multiple data bits, $D_0$-$D_3$, of input serial data 22 with W equal to 2. FIG. 5h illustrates proportional feedback path 40 comparing edge sample 36[0] against previous center data sample 34[0] to potentially generate an up signal 164. Sample 34[0] begins in the graph at a value of $C_X$, which was taken from a previous bit of input serial data 22. Sample 36[0] begins at a value of $E_X$, which was taken at an edge between two previous data bits of input serial data 22.

A rising edge of clock signal 14[0] occurs at time 0, and triggers flip-flop 162 to latch in the value of $C_X$ XOR $E_X$ from XOR gate 160 to flip-flop output 164. The rising edge of clock 14[0] also causes data sampler block 20 to take a new center data sample, $C_0$, and overwrite the value $C_X$ in sample bit 34[0] with the new center data sample value. Circuit delays allow flip-flop 162 to latch in a value based on $C_X$ prior to $C_X$ being overwritten by $C_0$. $C_0$ is equal to the value of $D_0$, either a binary zero or binary one. A rising edge of clock 16[0] occurs at time 90 and causes data sampler block 20 to take a new edge sample, $E_0$, and overwrite the value $E_X$ in sampler 36[0] with the new value.

At time 360, a second rising transition of in-phase clock 14[0] causes flip-flop 162 to latch in a new value from XOR gate 160, i.e., $C_0$ XOR $E_0$, to flip-flop output 164. Clock 14[0] also causes data sampler block 20 to take a new center data sample $C_2$, at time 360. The center data sample $C_2$ is stored in sample bit 34[0], overwriting $C_0$. Clock 16[0] has a rising transition at time 450 that causes data sampler block 20 to overwrite the value $E_0$ stored in sample bit 36[0] with the new edge sample value $E_2$.

Clock 16[0] and sample 36[0] are the same in FIG. 5i as in FIG. 5h. Rising edges of clock signal 16[0] cause flip-flop 182 to latch in a value of $E_0$ at time 90 and $E_2$ at time 450. FIG. 5i illustrates edge sample 36[0] being compared against the next center data sample, 34[1], to potentially generate a down pulse on phase error signal bit 42[1]. Sample 34[1] begins at a value $C_Y$, which was sampled from the data bit on input serial data 22 before $D_0$. The rising edge of clock 16[0] at time 90 causes flip-flop 182 to latch in the value $E_X$ XOR $C_Y$ before also causing a new value $E_0$ to overwrite the value $E_X$ in sample 36[0]. At time 180, clock signal 14[1] has a rising transition which causes data sampler 20 to store the value $D_1$ of input serial data 22 to sample 34[1] as $C_1$.

At time 450, the rising edge of clock 16[0] causes flip-flop 182 to latch in a new value from XOR gate 181, this time $E_0$ XOR $C_1$. The rising transition of clock 16[0] at time 450 also causes a new sample value, $E_2$, to be stored in edge sample bit 36[0]. $E_2$ is a sample taken near the edge between $D_2$ and $D_3$ of input serial data 22. At time 540, a rising transition of in-phase clock 14[1] causes the value $D_3$ from input serial data 22 to be stored in sample bit 34[1] as value $C_3$. The rising transition of in-phase clock 14[1] also causes an XOR comparison of the value $C_1$ with an edge value from sample 36[1] to be latched into flip-flop 172, which is not illustrated in FIG. 5i.

Figure 6A:
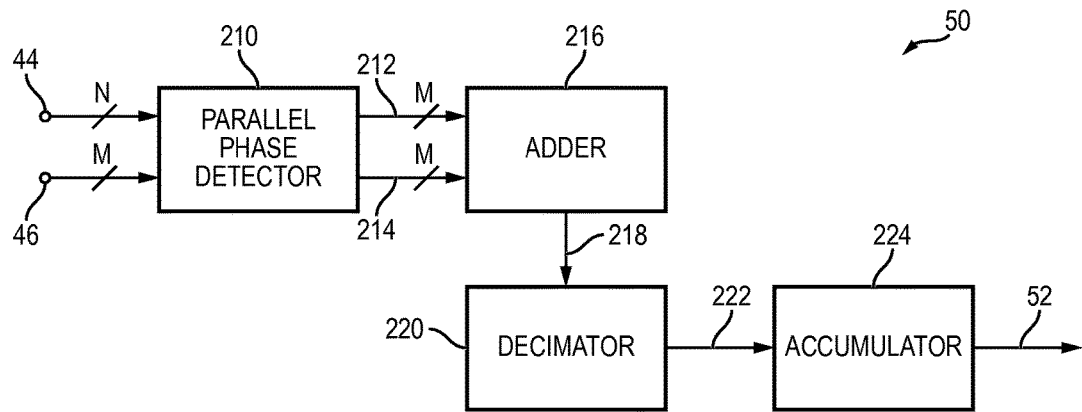
FIGS. 6a-6b illustrate an integral feedback path of the CDR circuit.

FIG. 6a illustrates integral feedback path 50 of CDR 10. Integral feedback path 50 receives N parallel center data samples 44 and M parallel edge samples 46. Center data samples 44 and edge samples 46 are routed to a parallel phase detector 210. Parallel phase detector 210 generates M up pulses 212 and M down pulses 214 to adder 216. Adder 216 uses up pulses 212 and down pulses 214 to create a single signed integer sum 218 representative of the early or late status of edge samples 36 as a whole. Sum 218 is routed to decimator 220 where the integer value is reduced if desired. Decimator 220 outputs a signed integer value 222 to accumulator 224. Accumulator 224 adds signed integer 222 to the already existing signed integer value being output as frequency error signal 52.

Parallel phase detector 210 operates on M edge samples 46. Parallel phase detector 210 determines the status of all M edge samples 46 as either early or late in parallel. In embodiments where integral feedback path 50 considers every edge sampled with quadrature clocks 16, N and M are the same value. Some edge samples 26 are ignored in some embodiments, either through an edge mute signal or using circuitry designed to automatically discard a certain number of samples, e.g., only keeping edge samples 26 that were taken using quadrature clock 16[0] and always discarding samples 26 taken with quadrature clock 16[1].

In embodiments where M is smaller than N, i.e., parallel phase detector 210 does not operate on all edge samples 26, only the M edge samples to be analyzed are routed to integral feedback path 50. In some embodiments, all N center data samples are still routed to parallel phase detector 210. In other embodiments, less than every center data sample 44 is routed to parallel phase detector 210. Only the center data samples 44 required to determine whether the specific M edge samples 46 were taken early or late are routed to parallel phase detector 210 even though all N center data samples 44 are still output to another module external to CDR 10 as the received data.

Parallel phase detector 210 operates similarly to proportional feedback path 40 in FIGS. 5a-5i. However, parallel phase detector 210 operates on all M edge samples 46 at once. Parallel phase detector 210 compares each edge sample 46 to respective immediately preceding and subsequent center data samples 44, similar to as shown in FIGS. 5b-5g for an individual edge sample, to determine whether each edge sample 46 was early or late. The determination occurs as explained with regard to proportional feedback path 40. If an edge sample 46 is a different value than an immediately preceding center data sample 44, then that edge sample 46 was late and the value of input serial data 22 changed before the quadrature clock 16 triggered the edge sample. If an edge sample 46 is a different value than an immediately subsequent center data sample 44, then that edge sample 46 was early and the value of input serial data 22 had not changed yet when quadrature clock 16 triggered the edge sample.

Parallel phase detector 210 outputs an M-wide bus of up pulses 212 and an M-wide bus of down pulses 214. Each individual bit of bus 212 is similar to phase error signal 42[0], and includes a binary one value if the particular edge associated with the bit was determined to be late. Each individual bit of bus 214 is similar to phase error signal 42[1], and includes a binary one value if the particular edge associated with the bit was determined to be early. Parallel phase detector 210 includes M parallel bang-bang phase detectors in one embodiment.

Adder 216 generates a signed integer representative of the total number of up pulses 212 and down pulses 214 that contain a binary one value. In one embodiment, adder 216 subtracts the total number of binary one bits of down pulses 214 from the total number of binary one bits of up pulses 212 and outputs the result as a signed integer. Sum 218 represents the net value of the up and down decisions made by parallel phase detector 210 and output at signals 212-214.

Decimator 220 reduces the value of sum 218 using an algorithm modifiable according to a decimation setting. In one embodiment, decimator 220 operates in either a proportional scaling mode or a majority vote mode. In proportional scaling mode, the output 222 of decimator 220 is proportional to the input 218. The scaling factor applied by decimator 220 in the proportional scaling mode can be adjusted so that sum 218 is divided by 1, 2, 4, 8, or 16. In other embodiments, other scaling factors are used. Proportional scaling mode is generally used to speed up locking time, and the scaling factor can be progressively modified in a form of gear-shifting of integral feedback path 50. Majority vote decimation is generally used when CDR 10 is locked to input serial data 22 and only small adjustments are required to clock generation block 12. When in majority vote mode, decimator 220 outputs a fixed positive or negative number depending on whether the M edge samples 46 as a whole were early or late.

Accumulator 224 outputs a signed integer on frequency error signal 52, which generally begins at, or has a reset value of, zero. For each clock cycle of clock 48, i.e., for each new set of N center data samples 44 and M edge samples 46, accumulator 224 adds output 222 of decimator 220 to the frequency error signal 52. If sum 218 is a positive number, accumulator 224 increases the value of frequency error signal 52. If sum 218 is a negative number, accumulator 224 decreases the value of frequency error signal 52. The magnitude of change in frequency error signal 52 depends on the number of binary one up pulses 212 relative to the number of down pulses 214, and also the decimation algorithm used by decimator 220. Oscillator frequency control block 80 receives frequency error signal 52 and modifies the frequency of clocks 88 from DCO 84 accordingly.

In one embodiment, integral feedback path 50 utilizes delta-sigma modulation to dither between two neighboring values of frequency error signal 52 at pseudorandom times. Delta-sigma modulation in integral feedback path 50 increases the capability of CDR 10 to handle consecutive identical digits (CIDs) received on input serial data 22. When a string of consecutive identical digits is received, there are no edges of input serial data 22 that cross over between a binary one and binary zero value, and parallel phase detector 210 is unable to detect whether any of the edge samples 46 are early or late. Without delta-sigma modulation, frequency error signal 52 generally does not update while receiving consecutive identical digits. The DCO 84 is unlikely to match the frequency of input serial data 22 exactly, and any error during consecutive identical digits will compound and potentially result in data errors. Increasing the resolution of frequency error signal 52 helps CDR 10 receive increased consecutive identical digits because the frequency error of DCO 84 can be reduced. Sigma-delta modulation helps by allowing the value of frequency error signal 52 to fluctuate between values rather than stay on a static value during consecutive identical digits.

Figure 6B:
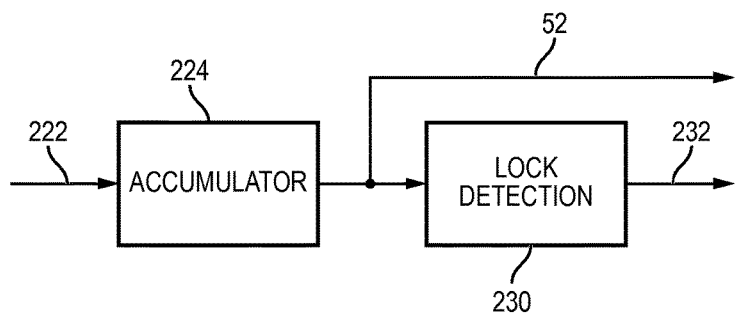

FIG. 6b illustrates an alternative embodiment of integral feedback path 50 with the addition of an optional lock or loss-of-lock detection block 230. Lock detection block 230 monitors the integer of frequency error signal 52 and determines a rate of change of the frequency error signal. Lock detection block 230 determines lock or loss-of-lock by comparing the rate of change of frequency error signal 52 to a configurable threshold. If the rate of change of frequency error signal 52 exceeds the threshold, lock detection block 230 considers the frequency lock of CDR 10 to be lost, and uses lock status signal 232 to notify relevant blocks of the CDR. When the rate of change of frequency error signal 52 is under the threshold, lock detection block 230 outputs the status as locked at lock status signal 232. In one embodiment, lock status signal 232 is a binary value, with a binary zero indicating a frequency lock and a binary one indicating a loss of frequency lock, although the opposite is also possible. In other embodiments, lock detection block 230 outputs the rate of change of frequency error signal 52, which can then be interpreted by other blocks of CDR 10.

Lock or loss-of-lock status signal 232 is used for various purposes in different embodiments. In one embodiment, a loss-of-lock indication triggers CDR 10 to run a calibration subroutine or reload calibration values from a previously executed calibration process. In some embodiments, DCO 84 is recentered to allow CDR 10 to relock.

Figure 7A:
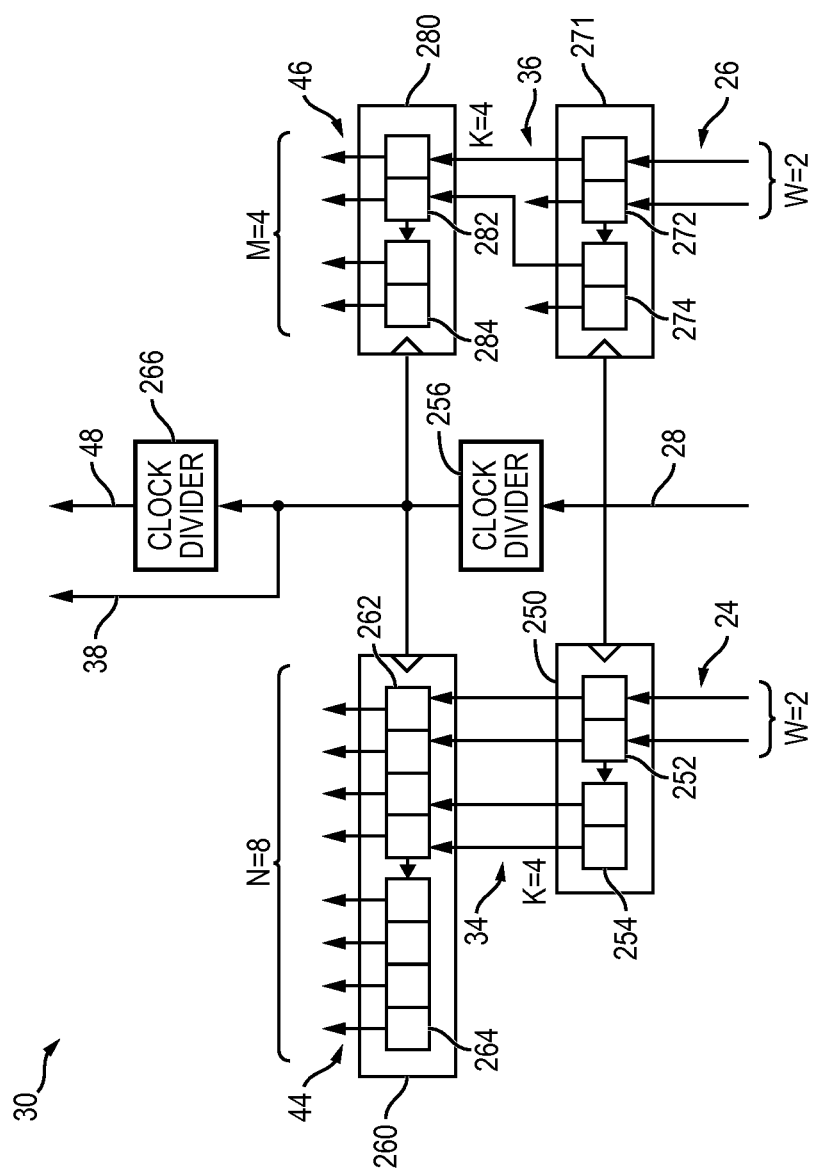
FIGS. 7a-7b illustrate alternative embodiments for the CDR deserializer.
Figure 7B:
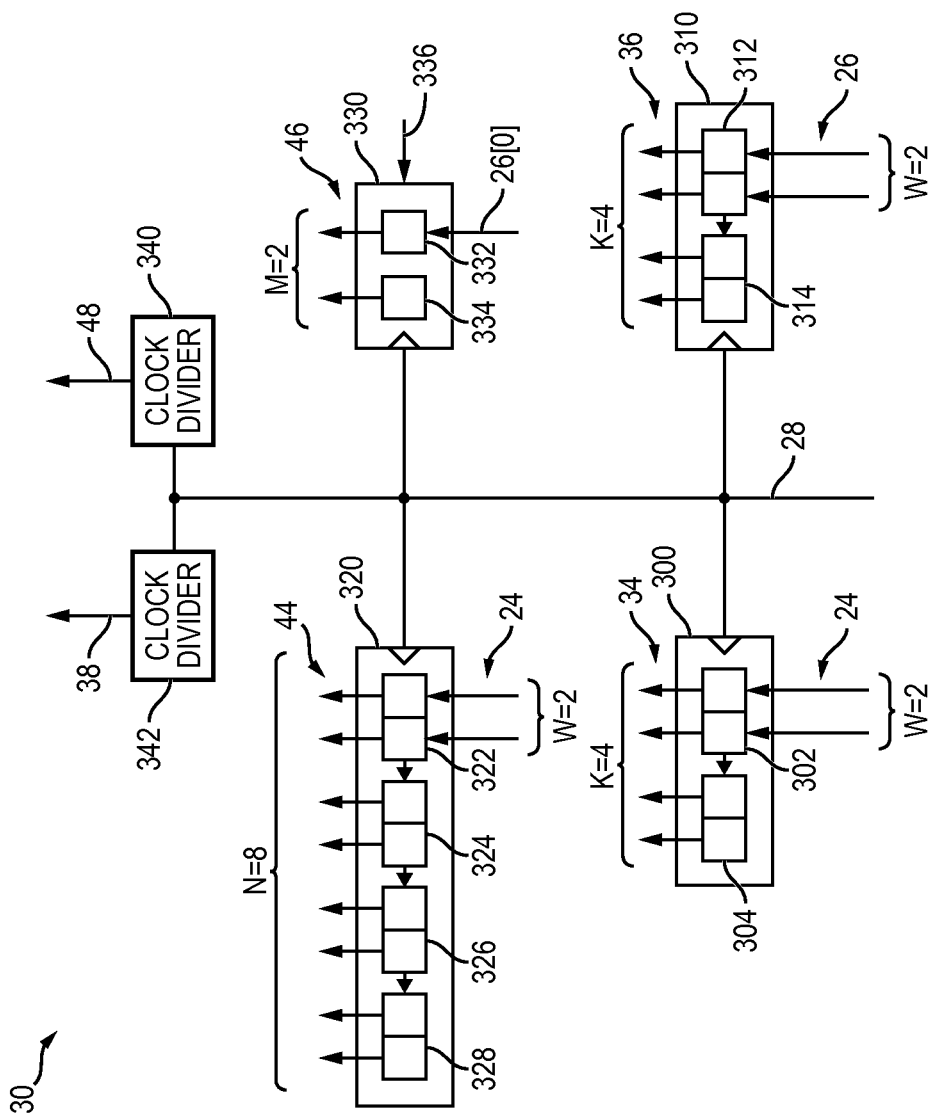

FIGS. 7a and 7b illustrate alternative embodiments of deserializer 30, with W still equal to two. In FIG. 7a, K is equal to four, meaning proportional feedback path 40 operates on four center data samples 34 and four edge samples 36 at a time. N is equal to 8 while M is equal to four, which means that integral feedback path 50 calculates the early/late status of four edge samples 46 out of every eight edge samples 26 that are actually taken from input serial data 22.

Shift register 250 receives center data samples 24, and deserializes the two center data samples 24 to four center data samples 34 using bit pairs 252 and 254. Bit pairs 252 and 254 output the two most recent sets of center data samples 24 in parallel as the four center data samples 34. Clock divider 256 creates clock signal 38 at half the frequency of clock signal 28, so that clock signal 38 includes a rising transition every time two new pairs of samples are available in shift register 250. Center data samples 34 are routed not only to proportional feedback path 40, but also to shift register 260 for further deserialization. Shift register 260 uses clock 38 to store four center data samples 34 in set of four bits 262 and shift the data existing in bits 262 to a second set of four bits 264. Shift register 260 outputs sets of bits 262 and 264 in parallel as an eight bit wide data bus of center data samples 44 to integral feedback path 50. Shift registers 250 and 260 operate as two deserializers connected in serial.

Clock divider 266 creates clock signal 48 at half the frequency of clock signal 38, so that clock 48 includes a rising edge every time a new set of eight center data samples 44 is ready to be read from shift register 260. In some embodiments, clock dividers 256 and 266 are formed from a single counter running off of clock 28, with clocks 38 and 48 tapped off of two different bits of the counter.

Shift register 271 operates similarly to shift register 250, but receives edge samples 26 rather than center data samples 24. Shift register 271 outputs the two most recent sets of W edge samples 26 in parallel as edge samples 36 to proportional feedback path 40. The most recent set of bits 26 is stored in bits 272, and the data in bits 272 is shifted to bits 274, every rising transition of clock 28. The output 36 of shift register 271 is connected as an input to shift register 280, similar to how center data samples 34 are routed from shift register 250 to shift register 260. However, M is only equal to four, meaning that only four edge samples 26 are used by integral feedback path 50 for every N, or eight in the illustrate embodiment, center data samples 24 received. Only one bit of each set of two bits 272 and 274 is connected as an input to shift register 280. The second bit of each set of bits 272 and 274 is routed to proportional feedback path 40 but not to shift register 280. The number of edge samples from a first deserializer, shift register 271, to a second deserializer, shift register 280, can be any value less than or equal to the total number of edge samples in shift register 271. Generally, H edge samples from shift register 271 are routed to be stored in shift register 280.

With only one out of every two bits routed from shift register 271 to shift register 280, shift register 280 only stores a sample of every other edge of input serial data 22. Every rising transition of clock signal 38, shift register 280 stores two of the four most recent edge samples 26 to bits 282, and shifts the data existing in bits 282 to bits 284. Bits 282 and 284 are output by shift register 280 in parallel as four-bit wide edge samples 46 to integral feedback path 50. In one embodiment, proportional feedback path 40 calculates phase error signal 42 based on one or more bits from shift registers 250 and 271 and one or more bits from center data samples 24 and edge samples 26.

In some embodiments, the bit-width of each deserializer output 34, 36, 44, and 46 is configurable. A control signal is received that reconfigures shift register 260 to utilize an additional eight bits that are available. The control signal also updates clock divider 266 so that clock divider 266 generates clock signal 48 at one fourth of the clock frequency of clock signal 38. N is equal to 16. Shift register 260 outputs the sixteen most recent center data samples 24, with sixteen new samples available every rising transition of clock 48. M could remain at four, in which case an edge mute signal would be used to block certain edge samples 36 from being stored in shift register 280. Only four edge samples 26 out of every sixteen edge samples 26 is stored as edge samples 46 and analyzed by integral feedback path 50. M could instead be increased to eight by assigning four additional bits to shift register 280. Each of the shift registers 250, 260, 271, and 280 can be grown or shrunk independently as desired by configuring CDR 10.

While FIG. 7a illustrates two sets of shift registers, i.e., two deserializers, connected in serial, FIG. 7b shows shift registers operating in parallel. Shift register 300 in FIG. 7b operates similarly to shift register 250 in FIG. 7a. Shift register 300 stores the two most recent sets of center data samples 24 in bit pairs 302 and 304, and outputs the bits in parallel as center data samples 34 to proportional feedback path 40. Shift register 310 in FIG. 7b operates similarly to shift register 271 in FIG. 7a. Shift register 310 stores the two most recent sets of edge samples 26 in bit pairs 312 and 314, and outputs the bits in parallel as edge samples 36 to proportional feedback path 40. In some embodiments, proportional feedback path 40 calculates phase error signal 42 based on one or more bits from shift registers 300 and 310 and one or more bits from center data samples 24 and edge samples 26.

Shift register 320 in FIG. 7b generates the N-wide center data samples 44, as does shift register 260 in FIG. 7a. However, shift register 320 receives the W center data samples 24 from data sampler block 20 in parallel with shift register 300 rather than the K center data samples 34 output by shift register 300. Shift register 320 stores two new bits from center data samples 24 in bits 322 every time clock 28 has a rising transition, and shifts bits 322 to bits 324, bits 324 to bits 326, and bits 326 to bits 328. Every four clock cycles of clock 28, shift register 320 contains eight new center data samples 44.

Shift register 330 in FIG. 7b generates edge samples 46 from edge samples 26 in parallel with shift register 310 generating edge samples 36 from edge samples 26. In FIG. 7b, M is equal to two. For every eight (N) center data samples of input serial data 22, two edge samples of the input serial data are considered by integral feedback path 50. Only one bit of the W edge samples 26 is connected as an input to shift register 330. Therefore, integral feedback path 50 is only capable of receiving one out of every two edge samples when W is equal to two, or one out of every four edge samples when W is equal to four. In other embodiments, any combination of edge samples, including every edge sample 26, can be received by shift register 330.

Edge mute signal 336 is used to control which samples 26[0] to store in shift register 330. For every new set of eight center data bits 44, only two edge samples can be stored in shift register 330 to be sent to integral feedback path 50 as edge samples 46. Edge mute signal 336 is held low in one embodiment, which causes shift register 330 to store every new edge sample 26[0] in bit 332 while shifting bit 332 to bit 334. In the embodiment where edge mute signal 336 is held low, integral feedback path 50 will always receive the last two edge samples 26[0] for a given set of center data samples 44. In other embodiments, a clock signal or other square wave is used for edge mute signal 336 to cause alternating edge samples 26[0] to be stored in shift register 330. Edge mute signal 336 is used to store any arbitrary edge samples 26[0] in shift register 330. In one embodiment, edge mute signal 336 disables a portion of the edge samplers in data sampler block 20, and also reduces the number of edges considered by proportional feedback path 40.

Clock divider 340 is similar to clock divider 266 in FIG. 7a. Clock divider 342 is similar to clock divider 256 in FIG. 7a. Like clock dividers 256 and 266, clock dividers 340 and 342 are implemented as a counter in some embodiments, with clock signals 38 and 48 being drawn from different bits depending on the configuration of the values of K and N.

Shift register 320 could be made any arbitrary size while FIG. 7b remains the same in other respects. If N were equal to 32, for instance if the device using CDR 10 used a 32-bit data bus and stored data samples 44 in a 32-bit FIFO, shift register 320 would store 16 new pairs of center data samples 24 for each cycle of clock 48. For each 32 bits of data received on input serial data 22, stored in parallel in shift register 320, two of the edge samples would be stored in shift register 330 for analysis by integral feedback path 50. The number of edge samples 46, i.e., the size of shift register 330, per N center data samples 44 could also be increased or decreased as desired. Edge mute signal 336 controls which edge samples are stored in shift register 330. For example, with M equal to two and N equal to thirty-two, shift register 330 could store the first and 16th edge sample of the group of thirty-two edge samples 26 taken during the period of clock signal 48.

CDR 10 with deserializer 30 uses two separate phase detectors, one for proportional feedback path 40 and one for integral feedback path 50. The separate phase detectors work on deserialized, or parallelized, samples of input serial data 22. Deserializing input serial data 22 allows proportional feedback path 40 and integral feedback path 50 to operate at slower clock speeds than the baud rate of input serial data 22. Slower clock rates of the logic of CDR 10 eases manufacturing constraints and allows for simpler designs. The clock speed of proportional feedback path 40 is reduced by a factor of K, while the clock speed of integral feedback path 50 is reduced by a factor of N. The reduced clock rate of integral feedback path 50 allows implementation using place-and-route layout with standard digital libraries. Edge mute signal 336 saves power by reducing the number of edge samples considered by integral feedback path 50.

Using DCO 84 allows CDR 10 to frequency lock to input serial data without the need for a reference clock. Therefore, multiple CDR 10 circuits are usable in a single device, and each can frequency lock to a different input serial data 22 even when the baud rates of the input serial data signals are different. Phase interpolator 94 is used to allow CDR 10 to shift the center data sample location within an eye pattern of input serial data 22, while maintaining edge samples 26 near the edges of the input serial data. Miniature phase interpolators are used to save real estate on the device.

While one or more embodiments of the present invention have been illustrated in detail, the skilled artisan will appreciate that modifications and adaptations to those embodiments may be made without departing from the scope of the present invention as set forth in the following claims.

What is claimed:

1. A clock and data recovery circuit (CDR), comprising:
   a digitally controlled oscillator (DCO), having a frequency control input and a delay control input:
   a data sampler coupled to receive a clock signal from the DCO;
   a deserializer including an input coupled to an output of the data sampler;
   a first phase detector coupled to receive a first data output of the deserializer and provide a delay control signal to the frequency control input of the DCO;
   a second phase detector coupled to a second data output of the deserializer; and
   an accumulator coupled to receive between an output of the second phase detector and to provide a frequency control signal to the frequency control input of the DCO.

2. The CDR of claim 1, further including a frequency lock detection block coupled to an output of the accumulator.

3. The CDR of claim 1, further including an eye monitor coupled to an input of the data sampler.

4. The CDR of claim 1, further including an edge mute signal coupled to the deserializer.

5. A clock and data recovery circuit (CDR), comprising:
a clock generator;
a data sampler coupled to receive a clock signal from the clock generator;
a deserializer coupled to an output of the data sampler;
a first phase detector coupled between a first output of the deserializer and a first input of the clock generator and configured to control a delay of the clock generator; and
a second phase detector coupled between a second output of the deserializer and a second input of the clock generator and configured to control a frequency of the clock generator.

6. The CDR of claim 5, wherein the deserializer includes:
a first shift register coupled to the first output of the deserializer; and
a second shift register coupled to the second output of the deserializer, wherein a bit-width of the second shift register is different than a bit-width of the first shift register.

7. The CDR of claim 6, wherein the first shift register and second shift register are coupled in series.

8. The CDR of claim 5, further including an accumulator coupled between the second phase detector and the clock generator.

9. The CDR of claim 5, further including a frequency lock detection block coupled between the second phase detector and the clock generator.

10. The CDR of claim 5, further including a clock divider coupled between the clock generator and the data sampler.

11. The CDR of claim 5, further including an edge mute signal coupled to the deserializer.

12. The CDR of claim 5, wherein the data sampler includes a decision feedback equalization circuit.

13. A clock and data recovery circuit (CDR), comprising:
a clock generator having a controllable delay and a controllable frequency;
a data sampler;
a deserializer coupled to an output of the data sampler;
a proportional feedback path including a first phase detector coupled to receive a first set of data from the deserializer and to, based on the first set of data, adjust the controllable delay of the clock generator; and
an integral feedback path including a second phase detector coupled to receive a second set of data from the deserializer and to, based on the second set of data, adjust the controllable frequency of the clock generator.

14. The CDR of claim 13, further including a phase interpolator coupled to receive a first clock signal from the clock generator and to provide a second clock signal to the data sampler.

15. The CDR of claim 13, further including an accumulator coupled to an output of the second phase detector.

16. The CDR of claim 13, wherein the data sampler includes a decision feedback equalization circuit.

17. The CDR of claim 13, wherein the second set of data includes a plurality of parallel data bits.

18. The CDR of claim 13, further including an edge mute signal coupled to an input of the deserializer.

19. A method of a clock and data recovery (CDR), comprising:
providing a data sampler with serial data;
deserializing an output of the data sampler;
receiving, at a first phase detector a first set of data from the deserializer;
receiving, at coupling a second phase detector a second set of data from the deserializer;
based on a delay error signal generated by the first phase detector using the first set of data, adjusting the delay of a clock generator; and,
based on a frequency error signal generated by the second phase detector using the second set of data, adjusting the frequency of the clock generator.

20. The method of claim 19, further including providing a clock signal to the data sampler using a phase interpolator.

21. The method of claim 20, further including calibrating the phase interpolator by providing the clock signal as a data input to the data sampler.

* * * * *